(12) United States Patent
Li

(10) Patent No.: US 10,269,906 B2
(45) Date of Patent: Apr. 23, 2019

(54) SEMICONDUCTOR DEVICE HAVING TWO SPACERS

(71) Applicant: TAIWAN SEMICONDUCTOR MANUFACTURING CO., LTD., Hsinchu (TW)

(72) Inventor: Po-Hsueh Li, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/459,155

(22) Filed: Mar. 15, 2017

(65) Prior Publication Data

US 2018/0151678 A1 May 31, 2018

Related U.S. Application Data

(60) Provisional application No. 62/427,940, filed on Nov. 30, 2016.

(51) Int. Cl.
| | |
|---|---|
| *H01L 27/088* | (2006.01) |
| *H01L 29/417* | (2006.01) |
| *H01L 29/66* | (2006.01) |
| *H01L 21/8234* | (2006.01) |
| *H01L 21/285* | (2006.01) |
| *H01L 29/78* | (2006.01) |
| *H01L 27/12* | (2006.01) |
| *H01L 29/08* | (2006.01) |
| *H01L 29/165* | (2006.01) |

(52) U.S. Cl.
CPC .. *H01L 29/41791* (2013.01); *H01L 21/28512* (2013.01); *H01L 21/823431* (2013.01); *H01L 21/823475* (2013.01); *H01L 27/0886* (2013.01); *H01L 27/1211* (2013.01); *H01L 29/66795* (2013.01); *H01L 29/785* (2013.01); *H01L 21/823425* (2013.01); *H01L 21/823468* (2013.01); *H01L 29/0847* (2013.01); *H01L 29/165* (2013.01); *H01L 29/66545* (2013.01); *H01L 29/7848* (2013.01)

(58) Field of Classification Search
CPC ......... H01L 29/41791; H01L 21/02532; H01L 21/0262
USPC ........................................................ 257/401
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

*Primary Examiner* — Caleb E Henry
(74) *Attorney, Agent, or Firm* — McClure, Qualey & Rodack, LLP

(57) ABSTRACT

A semiconductor device includes a substrate, a source/drain feature, a gate structure, a contact, a gate spacer, and a contact spacer. The source/drain feature is at least partially disposed in the substrate. The gate structure is disposed on the substrate and adjacent to the source/drain feature. The contact is electrically connected to the source/drain feature. The gate spacer is disposed on a sidewall of the gate structure and between the gate structure and the contact. The contact spacer is disposed on the gate spacer and on a sidewall of the contact. An interface is formed between the gate spacer and the contact spacer, and a bottom surface of the contact spacer is in contact with the contact.

20 Claims, 24 Drawing Sheets

(56) References Cited

U.S. PATENT DOCUMENTS

| | | | |
|---|---|---|---|
| 8,860,148 B2 | 10/2014 | Hu et al. | |
| 9,040,363 B2 * | 5/2015 | Basker | H01L 29/6681 |
| | | | 438/151 |
| 9,105,490 B2 | 8/2015 | Wang et al. | |
| 9,236,267 B2 | 1/2016 | De et al. | |
| 9,236,300 B2 | 1/2016 | Liaw | |
| 9,418,897 B1 * | 8/2016 | Ching | H01L 29/66795 |
| 9,520,482 B1 | 12/2016 | Chang et al. | |
| 9,576,814 B2 | 2/2017 | Wu et al. | |
| 9,768,163 B2 * | 9/2017 | Lee | H01L 27/088 |
| 9,978,746 B2 * | 5/2018 | Yeo | H01L 27/088 |
| 2016/0049394 A1 * | 2/2016 | Shin | H01L 27/0886 |
| | | | 257/401 |
| 2016/0233246 A1 * | 8/2016 | Anderson | H01L 29/7853 |
| 2016/0307890 A1 * | 10/2016 | Yeo | H01L 27/088 |
| 2016/0359012 A1 * | 12/2016 | Yu | H01L 29/4991 |
| 2016/0365426 A1 * | 12/2016 | Ching | H01L 29/6656 |
| 2017/0084714 A1 * | 3/2017 | Ching | H01L 29/6656 |
| 2017/0278967 A1 * | 9/2017 | Kang | H01L 21/0245 |
| 2017/0301773 A1 * | 10/2017 | Park | H01L 29/66545 |

* cited by examiner

SEMICONDUCTOR DEVICE HAVING TWO SPACERS

PRIORITY CLAIM AND CROSS-REFERENCE

This application claims priority to U.S. Provisional Application Ser. No. 62/427,940, filed Nov. 30, 2016, which is herein incorporated by reference.

BACKGROUND

As integrated circuits continue to scale downward in size, the finFET (fin field effect transistor) is becoming an attractive device for use in semiconductor integrated circuits (ICs). In a finFET, the channel is formed by a semiconductor fin, and a gate electrode is located and wrapped around the fin. With finFETs, as with other transistor types, the contacts that connect the source, drain, and gate of the transistor are a factor in the production of reliable integrated circuits with desired performance characteristics. It is therefore desirable to have improvements in the fabrication of finFET transistors to improve the quality of the transistor contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 7A are perspective views of a method for manufacturing a semiconductor device at various stages in accordance with some embodiments of the present disclosure.

FIGS. 1B to 7B are cross-sectional view respectively taking along line B-B of FIGS. 1A to 7A.

FIGS. 1C to 7C are cross-sectional view respectively taking along line C-C of FIGS. 1A to 7A.

FIGS. 8A to 12A are perspective views of a method for manufacturing a semiconductor device at various stages in accordance with some embodiments of the present disclosure.

FIGS. 8B to 12B are cross-sectional view respectively taking along line B-B of FIGS. 8A to 12A.

FIGS. 8C to 12C are cross-sectional view respectively taking along line C-C of FIGS. 8A to 12A.

DETAILED DESCRIPTION

Figure 1A:
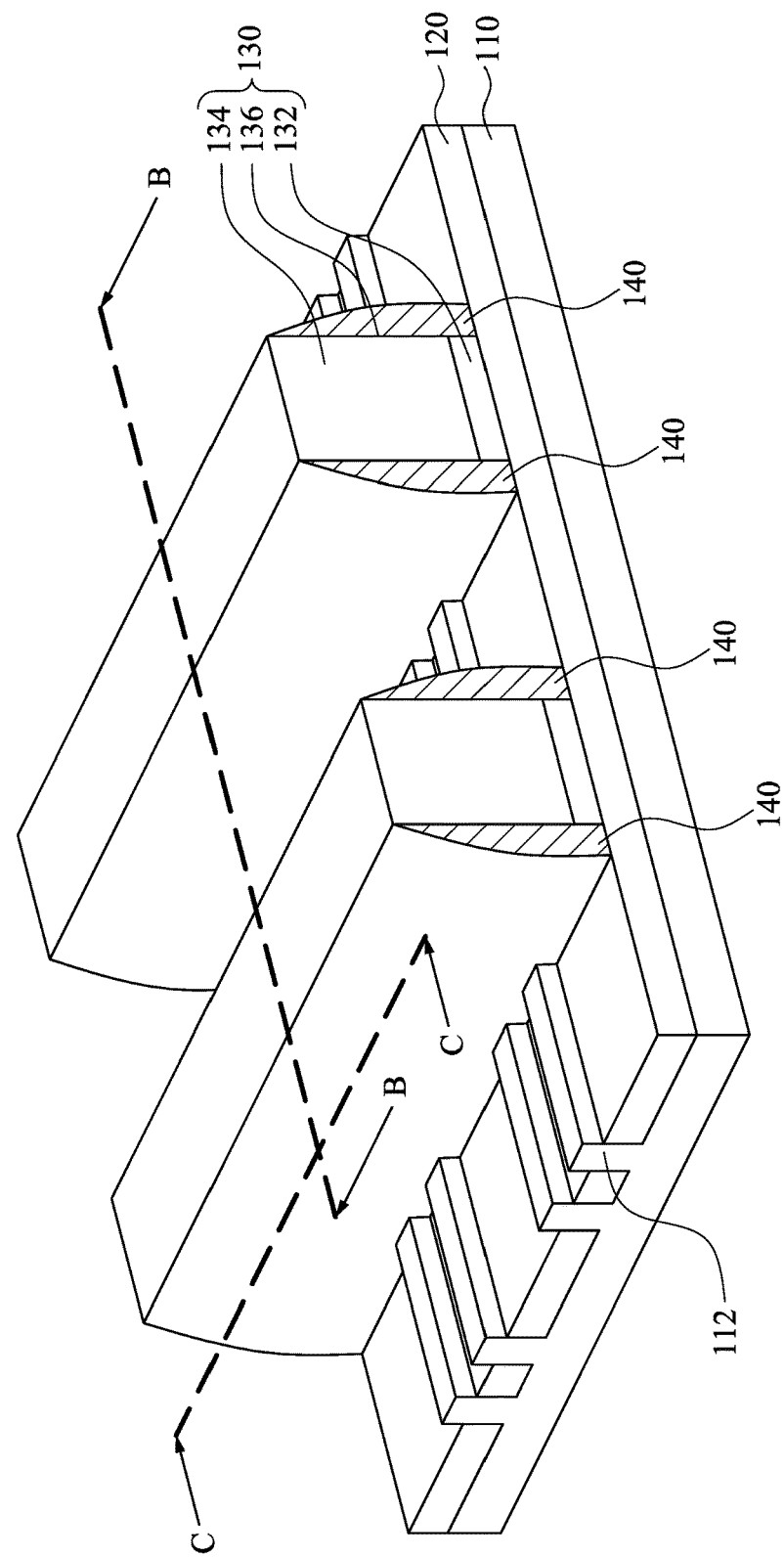

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations.

Figure 1B:
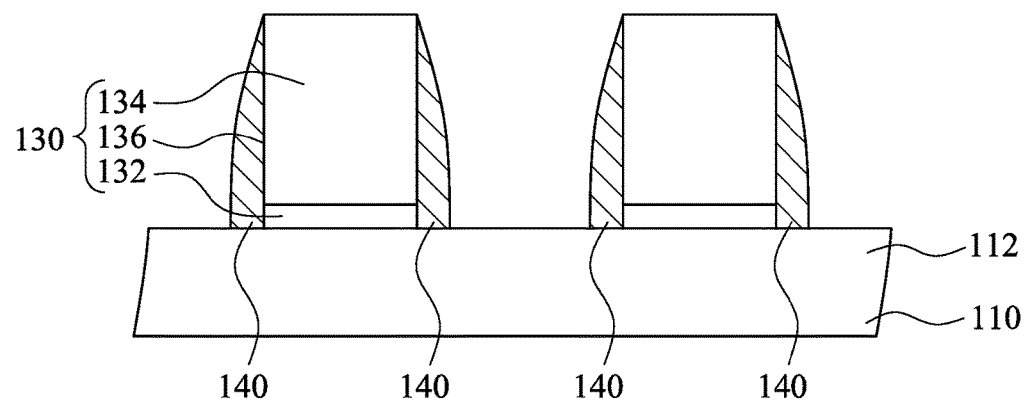
Figure 1C:
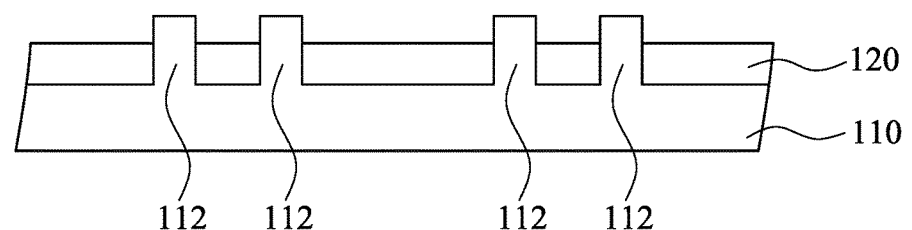

FIGS. 1A to 7A are perspective views of a method for manufacturing a semiconductor device at various stages in accordance with some embodiments of the present disclosure, FIGS. 1B to 7B are cross-sectional view respectively taking along line B-B of FIGS. 1A to 7A, and FIGS. 1C to 7C are cross-sectional view respectively taking along line C-C of FIGS. 1A to 7A. Reference is made to FIGS. 1A to 1C. A substrate 110 is provided. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 further includes a plurality of semiconductor fins 112 protruded from the substrate 110. The semiconductor fins 112 serve as source/drain features of transistors. It is note that the numbers of the semiconductor fins 112 in FIGS. 1A and 1C are illustrative, and should not limit the claimed scope of the present disclosure. A person having ordinary skill in the art may select suitable numbers for the semiconductor fins 112 according to actual situations. The semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 112 may be epitaxially grown. For example, exposed portions of an underlying material, such as an exposed portion of the substrate 110, may be used in an epitaxial process to form the semiconductor fins 112. A mask may be used to control the shape of the semiconductor fins 112 during the epitaxial growth process.

A plurality of isolation features 120, such as shallow trench isolation (STI), formed in the substrate 110 to separate various devices. The formation of the isolation features 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

In FIGS. 1A and 1B, a gate structure 130 including a gate dielectric 132 and a gate electrode 134 is formed on the substrate 110. In some embodiments, in order to form the gate structure 130, a gate dielectric layer is formed on the substrate 110, followed by a gate electrode layer. The gate dielectric layer and the gate electrode layer are then patterned, forming the gate dielectric 132 and the gate electrode 134. As is known in the art, hard masks may be formed on the gate structure 130 for process reasons, wherein the hard masks may include silicon nitride.

The gate dielectric 132 may include various known materials such as a silicon oxide, a silicon nitride, or a silicon oxynitride. Alternatively, the gate dielectric 132 may have high dielectric constant (HK) values. In some embodiments, the gate dielectric 132 includes $HfO_2$. Alternatively, the gate dielectric 132 may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The gate dielectric 132 can be formed by a suitable process such as atomic layer deposition (ALD). Other methods to form the gate dielectric 132 include metal organic chemical vapor deposition (MOCVD), physical vapor deposition (PVD), UV-Ozone Oxidation, or molecular beam epitaxy (MBE).

The gate electrode 134 can be made of polycrystalline-silicon (poly-Si), polycrystalline silicon-germanium (poly-SiGe), or other suitable materials. For example, in some embodiments, the gate electrode 134 includes polysilicon deposited undoped by low-pressure chemical vapor deposition (LPCVD). The polysilicon may also be deposited, for example, by furnace deposition of an in-situ doped polysilicon. Alternatively, the gate electrode 134 may include other suitable materials. Further, the gate electrode 134 may be doped poly-silicon with uniform or non-uniform doping.

A plurality of gate spacers 140 are respectively formed on sidewalls 136 of the gate structure 130. The gate spacer 140 may include a seal spacer and a main spacer (not shown). The gate spacers 140 include one or more dielectric materials, such as silicon oxide, silicon nitride, silicon oxynitride, or combinations thereof. The seal spacers are formed on sidewalls 136 of the gate structure 130 and the main spacers are formed on the seal spacers. In some embodiments, the gate spacers 140 include additional layers. For example, an additional layer (not shown) is formed on the seal spacer and then the main spacer is formed on the additional layer. In some embodiments, the seal spacer includes silicon nitride, the additional layer includes silicon oxide, and the main spacer includes silicon nitride. The seal spacers, the main spacers, and the additional layer are formed by deposition, photolithography, and etch processes in a known manner. The gate spacers 140 can be formed using a deposition method, such as plasma enhanced chemical vapor deposition (PECVD), low-pressure chemical vapor deposition (LP-CVD), sub-atmospheric chemical vapor deposition (SACVD), or the like. The formation of the gate spacers 140 may include blanket forming spacer layers, and then performing etching steps to remove the horizontal portions of the spacer layers. The remaining vertical portions of the gate spacer layers form the gate spacers 140.

Figure 2A:
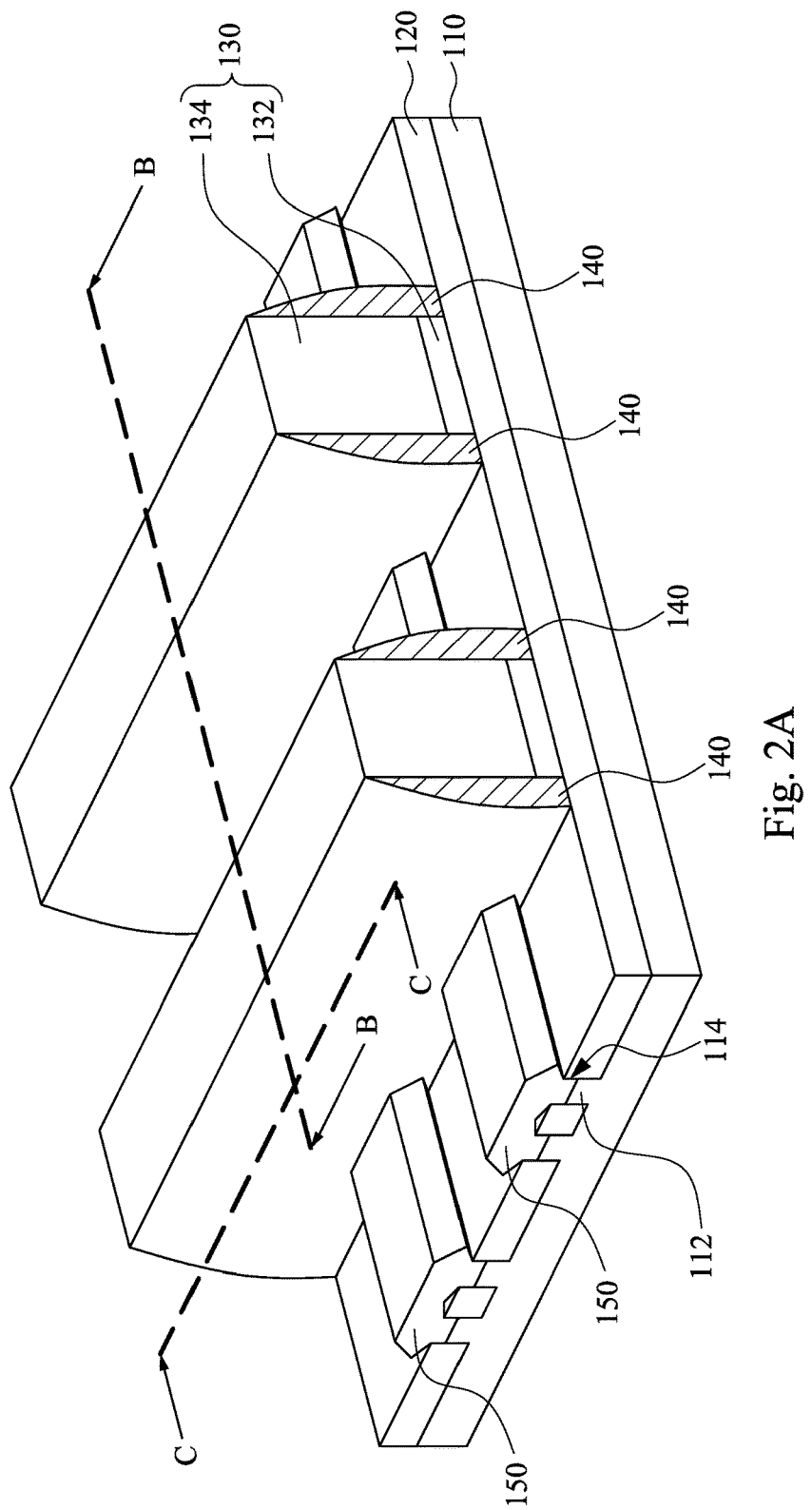
Figure 2B:
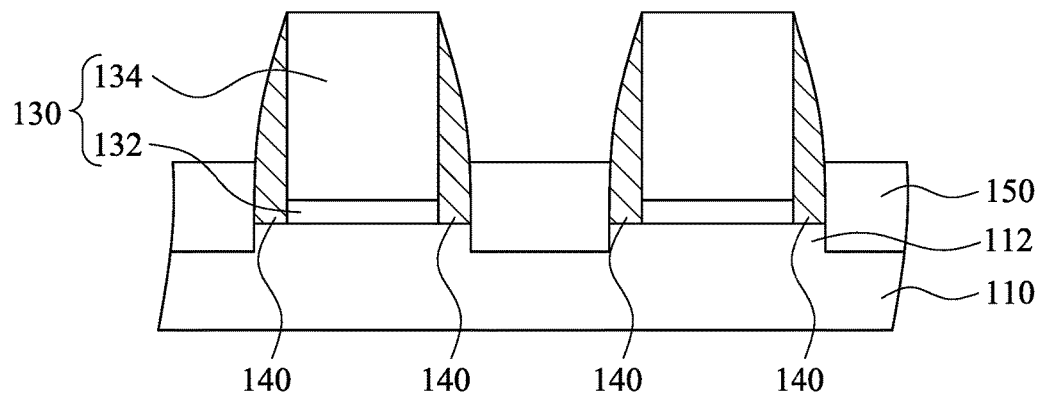
Figure 2C:
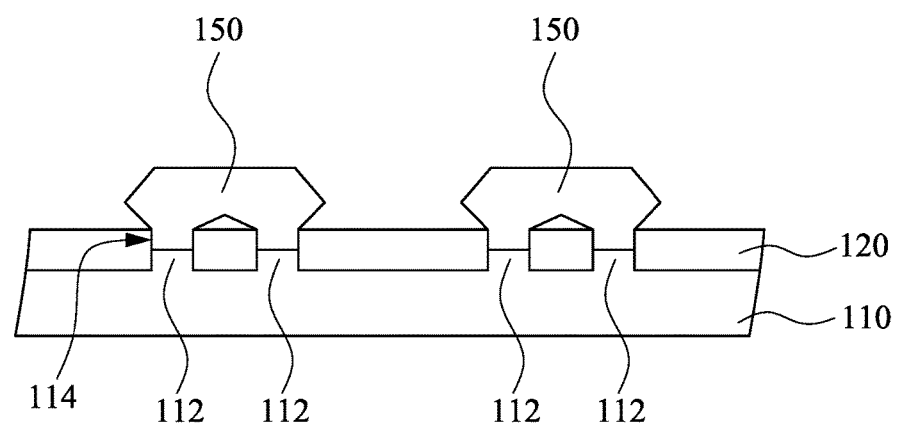

Reference is made to FIGS. 2A to 2C. A plurality of recesses 114 are formed at opposite sides of the gate structure 130 by etching the substrate 110. The gate structure 130 and the gate spacers 140 act as an etching mask in the formation of the recesses 114. The etching process includes a dry etching process, a wet etching process, or combinations thereof. In FIGS. 2A to 2C, the etching process utilizes a combination dry and wet etching. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. For the dry etching process, the etching gas may be selected from, for example, $HBr$, $Cl_2$, $Cl_4$, $SF_6$, $NF_3$, $CH_2F_2$, $N_2$, $O_2$, Ar, He, and combinations thereof. The etching gas may be a single-etching step or may include a plurality of etching steps. In the recessing step, the plasma of the etching gas is generated.

A semiconductor material is deposited in the recesses 114 to form epitaxy structures 150 which are referred to as source/drain features. The epitaxy structures 150 may alternatively be referred to as raised source and drain regions. For example, the semiconductor material, such as silicon germanium (SiGe), is epitaxially grown in the recesses 114 to form the epitaxy structures 150. In some embodiments, the epitaxy may be a selective epitaxial growth (SEG) process, in which the semiconductor material is grown in the recesses 114, and not on dielectric materials. In some other embodiments, the epitaxy may include CVD deposition techniques (e.g., vapor-phase epitaxy (VPE) and/or ultra-high vacuum CVD (UHV-CVD)), molecular beam epitaxy, other suitable epitaxy processes, or combinations thereof. The epitaxy process may use gaseous and/or liquid precursors, which may interact with the composition of the substrate 110. The epitaxy structures 150 may have a lattice constant greater than the lattice constant of the substrate 110. The precursor for growing SiGe may include germane ($GeH_4$, which provides germanium), dichlorosilane (DCS, which provides silicon), and the like. Desired p-type or n-type impurities may be, or may not be, doped while the epitaxial growth proceeds. The doping may be achieved by an ion implantation process, plasma immersion ion implantation (PIII) process, gas and/or solid source diffusion process, other suitable process, or combinations thereof. The epitaxy structures 150 may further be exposed to annealing processes, such as a rapid thermal annealing process. After being annealed, SiGe will try to restore its lattice constant, thus introducing compressive stresses to the channel regions of the resulting PMOS devices. Throughout the description, the SiGe epitaxy regions are alternatively referred to as SiGe stressors. In alternative embodiments, other semiconductor materials such as silicon carbon (SiC) may be grown to generate tensile stress in the channels of the resulting semiconductor device, which may be an n-type semiconductor device.

Figure 3A:
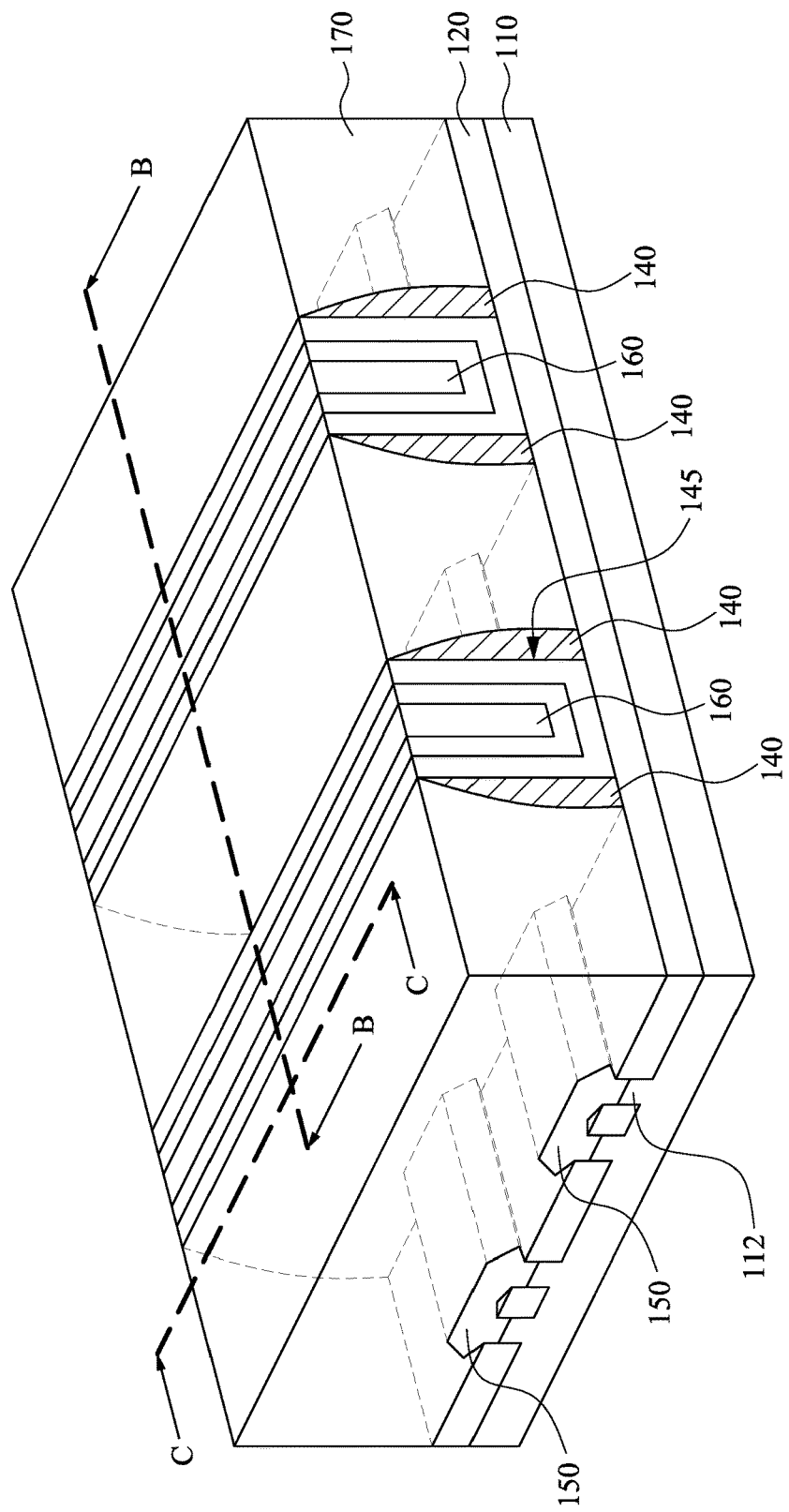
Figure 3B:
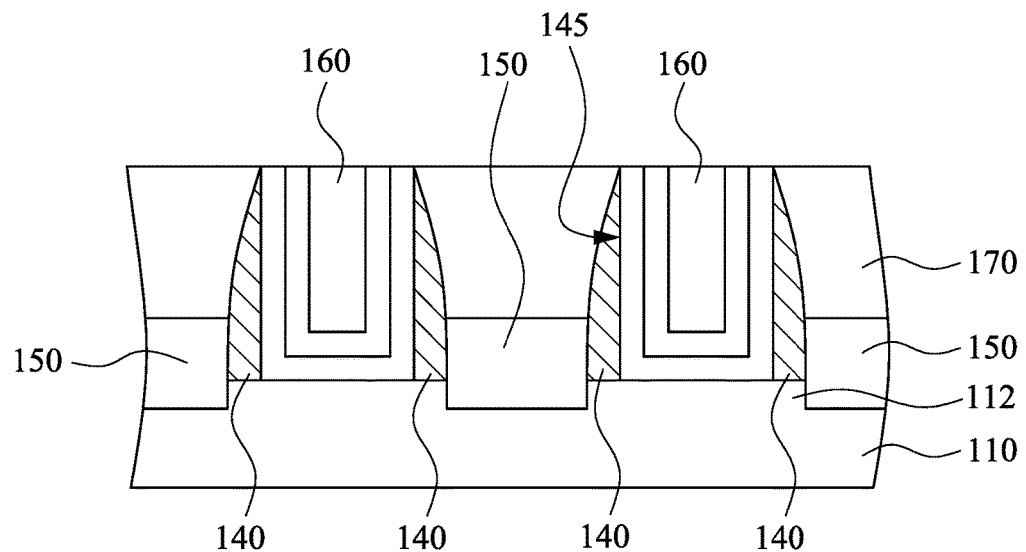
Figure 3C:
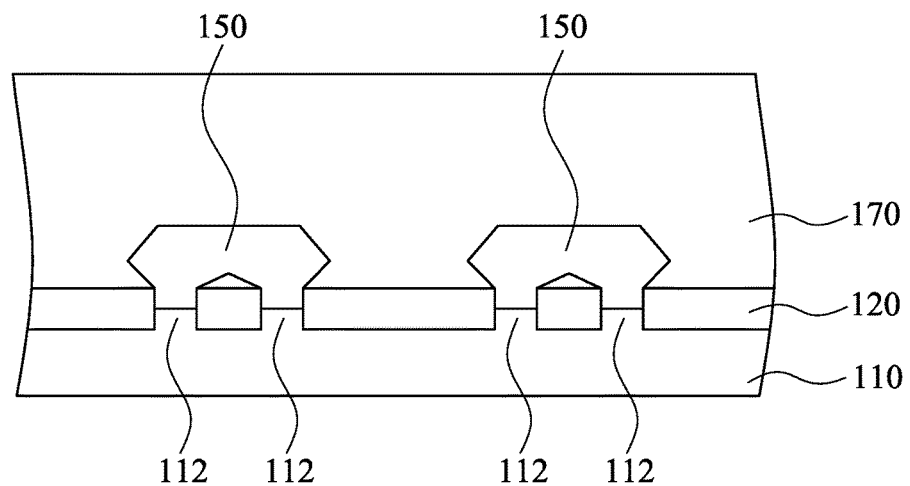

Reference is made to FIGS. 3A to 3C. A dielectric layer, an interlayer dielectric (ILD) 170 for example, is then formed to cover the structure of FIGS. 2A to 2C. The interlayer dielectric 170 may be formed by chemical vapor deposition (CVD), high-density plasma CVD, spin-on, sputtering, or other suitable methods. In some embodiments, the interlayer dielectric 170 includes silicon oxide. In some other embodiments, the interlayer dielectric 170 may include silicon oxy-nitride, silicon nitride, or a low-k material.

In some embodiments, a replacement gate (RPG) process scheme is employed. In a RPG process scheme, a dummy polysilicon gate (the gate electrode 134 in this case) is formed first and is replaced later by a metal gate after high thermal budget processes are performed. In some embodiments, the gate electrode 134 (see FIGS. 1A and 1B) is removed to form an opening 145 with the gate spacers 140 as its sidewall. In some other embodiments, the gate dielectric 132 (see FIGS. 1A and 1B) is removed as well. Alternatively, in some embodiments, the gate electrode 134 is removed while the gate dielectric 132 retains. The gate electrode 134 (and the gate dielectric 132) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Then, a gate structure 160 made of metal is formed in the opening 145. In other words, the gate spacers 140 are disposed on opposite sidewalls of the gate structure 160. The gate structure 160 formed may also include gate dielectric layer(s), capping layer(s), fill layer(s), and/or other suitable layers that are desirable in a metal gate structure. A work function metal layer included in the gate structure 160 may be an n-type or p-type work function layer. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the gate structure 160 formed is a p-type metal gate including a p-type work function layer. In some embodiments, the capping layer included in the gate structure 160 may include refractory metals and their nitrides (e.g. TiN, TaN, W$_2$N, TiSiN, TaSiN). The cap layer of the gate structure 160 may be deposited by PVD, CVD, Metal-organic chemical vapor deposition (MOCVD) and ALD. In some embodiments, the fill layer included in the gate structure 160 may include tungsten (W). The metal layer may be deposited by ALD, PVD, CVD, or other suitable process.

Figure 4A:
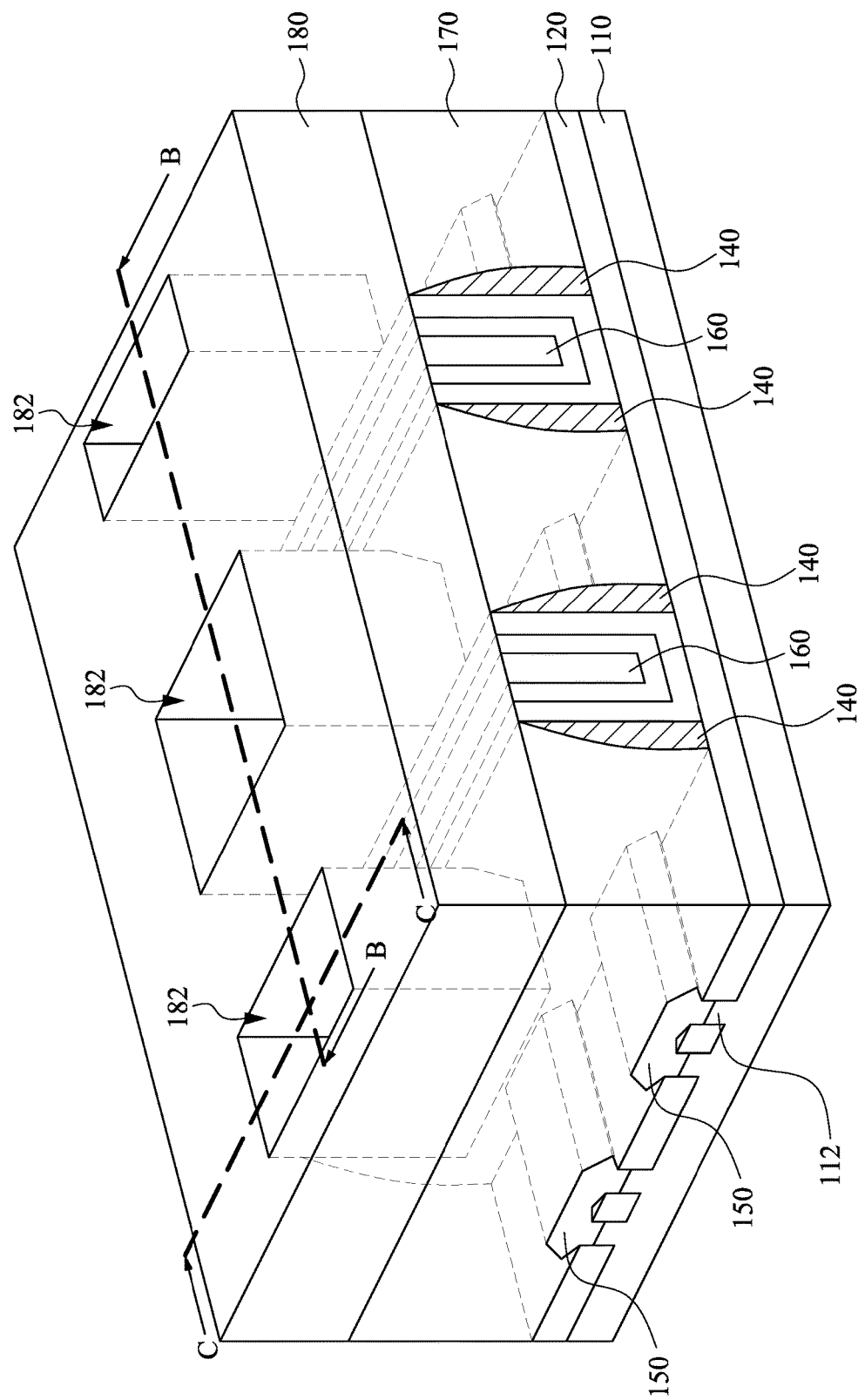
Figure 4B:
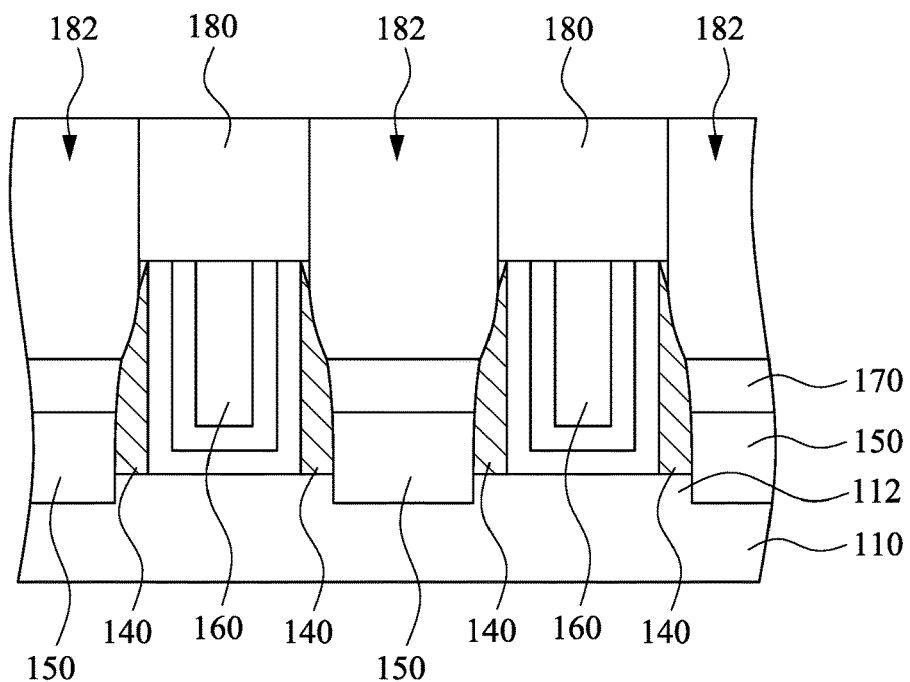
Figure 4C:
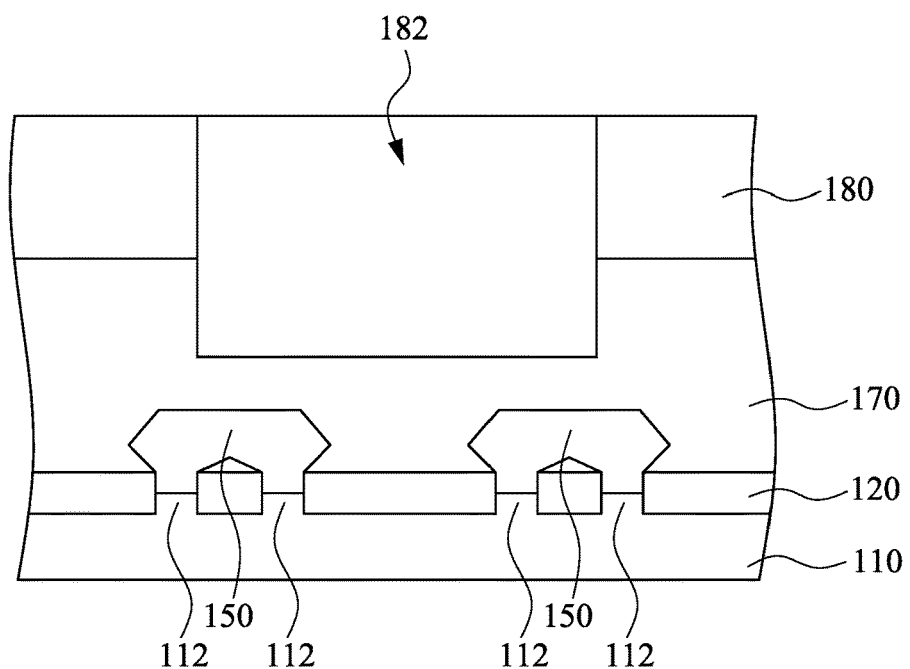

Reference is made to FIGS. 4A to 4C. Another dielectric layer, an interlayer dielectric (ILD) 180 for example, is then formed to cover the structure of FIGS. 3A to 3C. The interlayer dielectric 180 may be formed by chemical vapor deposition (CVD), high-density plasma CVD, spin-on, sputtering, or other suitable methods. In some embodiments, the interlayer dielectric 180 includes silicon oxide. In some other embodiments, the interlayer dielectric 180 may include silicon oxy-nitride, silicon nitride, or a low-k material.

The interlayer dielectrics 180 and 170 are then etched to form a plurality of openings 182 by various methods, including a dry etch, a wet etch, or a combination of dry etch and wet etch. The openings 182 extend substantially vertically through the interlayer dielectrics 180 and 170. However, the openings 182 do not expose the epitaxy structures 150. That is, the bottom surface of the openings 182 are above the epitaxy structures 150, and a portion of the interlayer dielectric 170 is between the opening 182 and the epitaxy structure 150. In some embodiments, top portions of the gate spacers 140 are removed when the openings 182 are formed. Therefore, the openings 182 expose the gate spacers 140. In some embodiments, the openings 182 may expose the sidewalls of the gate structure 160 depending on the sizes of the openings 182. The term "substantially" as used herein may be applied to modify any quantitative representation which could permissibly vary without resulting in a change in the basic function to which it is related.

Figure 5A:
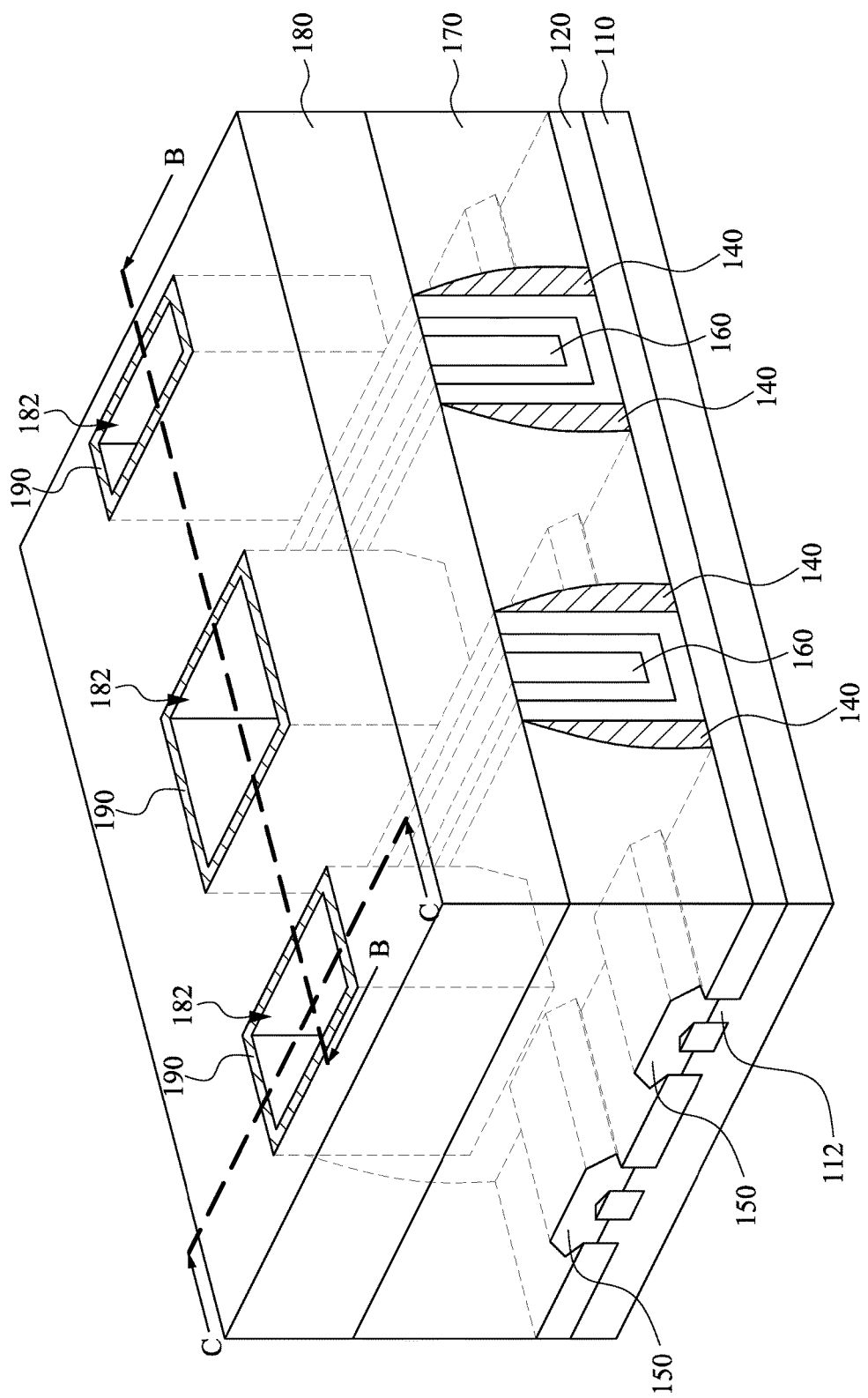
Figure 5B:
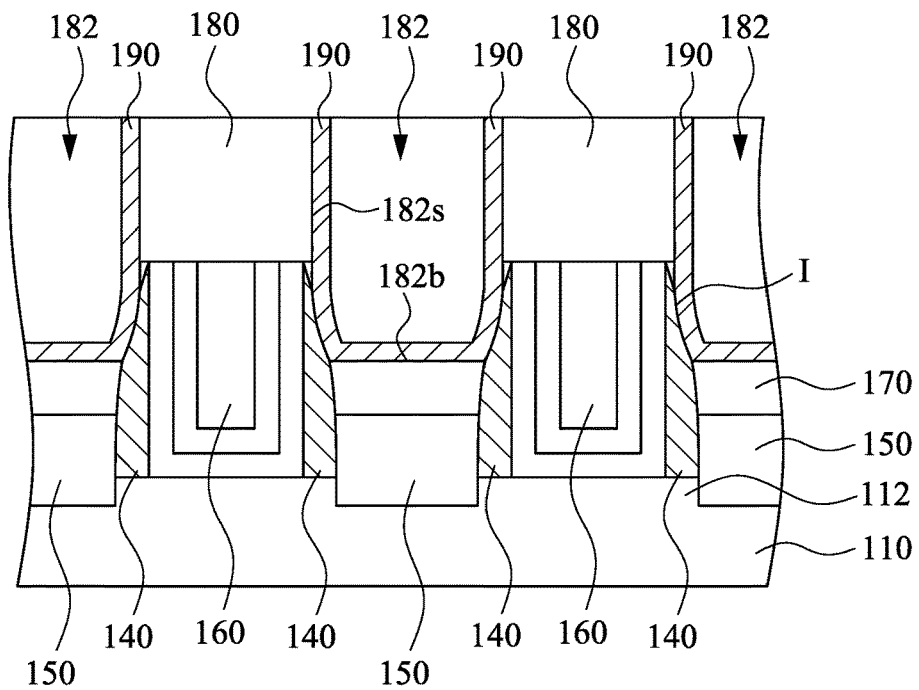
Figure 5C:
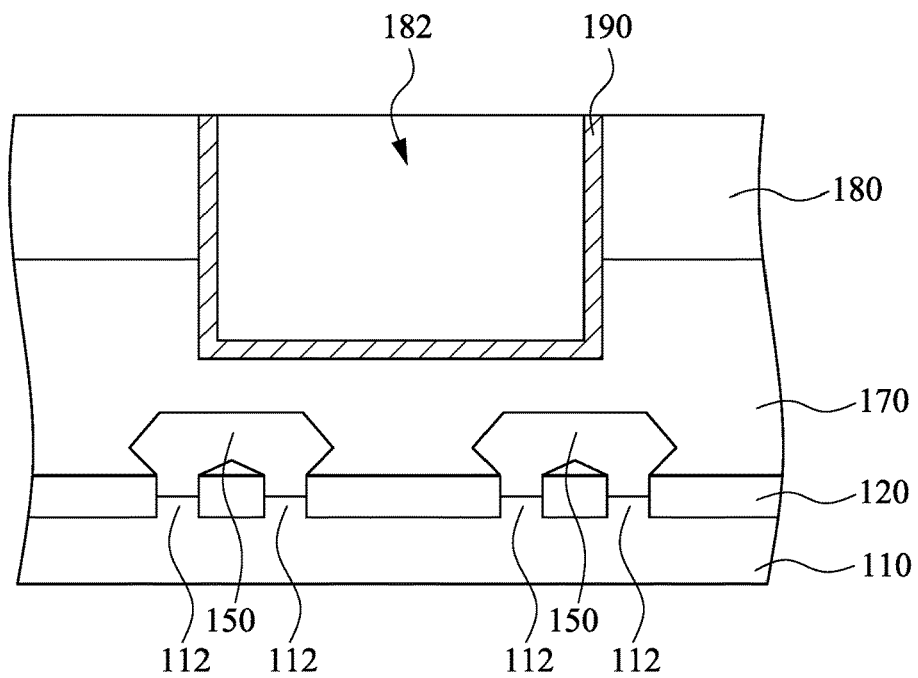

Reference is made to FIGS. 5A to 5C. A plurality of contact spacers 190 are conformally formed in the openings 182 and in contact with sidewalls of the openings 182. For example, the contact spacers 190 are formed by blanket depositing a dielectric layer (not shown) on the previously formed structure (i.e., the structure in FIGS. 4A to 4C). The dielectric layer(s) may include silicon nitride (SiN), oxynitride, silicon carbon (SiC), silicon oxynitride (SiON), oxide, and the like and may be formed by methods utilized to form such a layer, such as chemical vapor deposition (CVD), plasma enhanced CVD, sputter, and other methods known in the art. Subsequently, a chemical mechanical planarization (CMP) process may then be performed to planarize the dielectric layer to form the contact spacers 190.

In FIGS. 5B and 5C, the contact spacers 190 are in contact with the sidewalls 182s and the bottom surface 182b of the openings 182. In other words, the contact spacers 190 are in contact with the gate spacers 140 and the interlayer dielectrics 170 and 180. That is, an interface I is formed between the contact spacer 190 and the gate spacer 140. Furthermore, the contact spacers 190 are disposed above the epitaxy structures 150, and portions of the interlayer dielectric 170 is between the contact spacers 190 and the epitaxy structures 150, such that the contact spacers 190 are separated from the epitaxy structures 150.

Figure 6A:
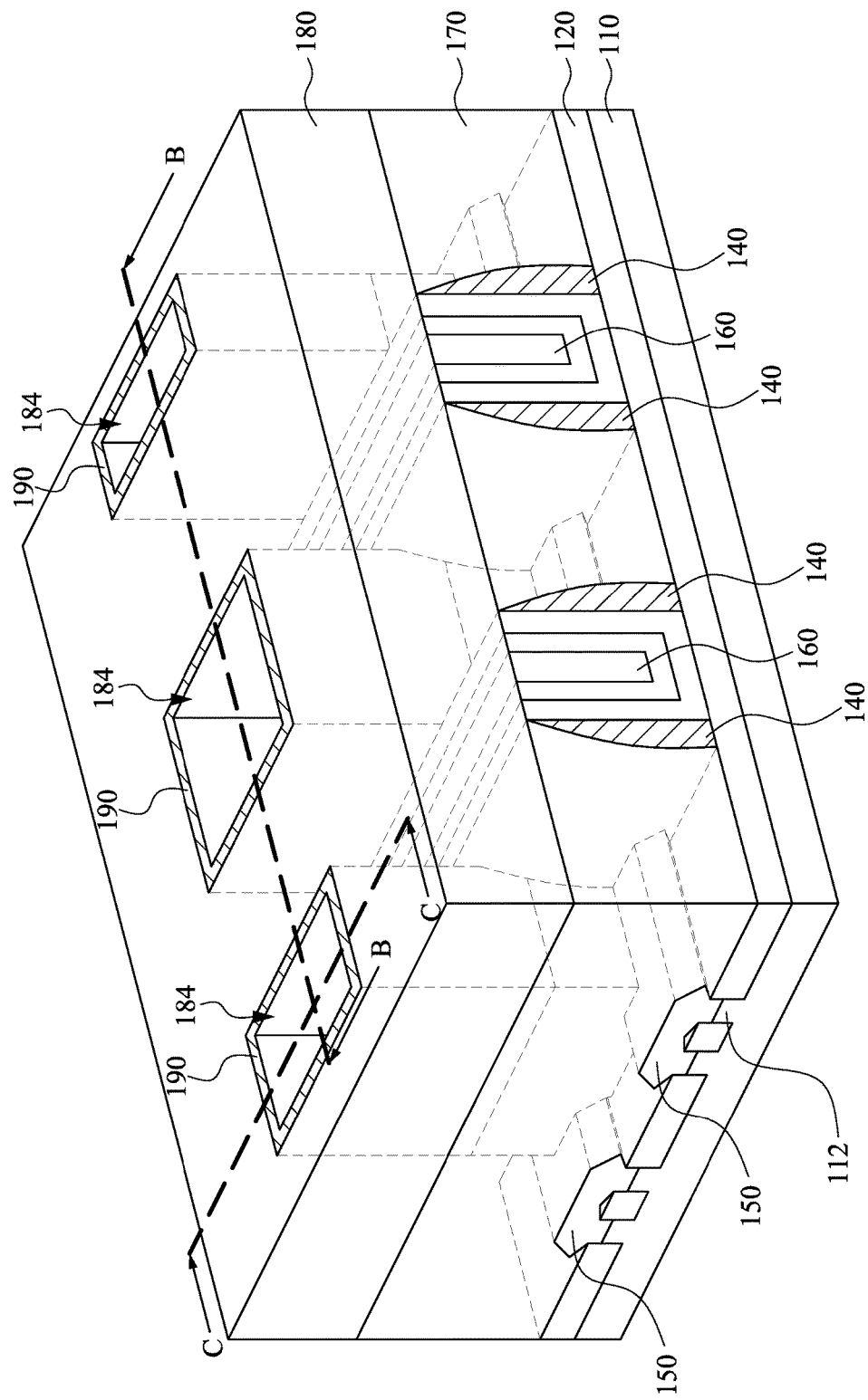
Figure 6B:
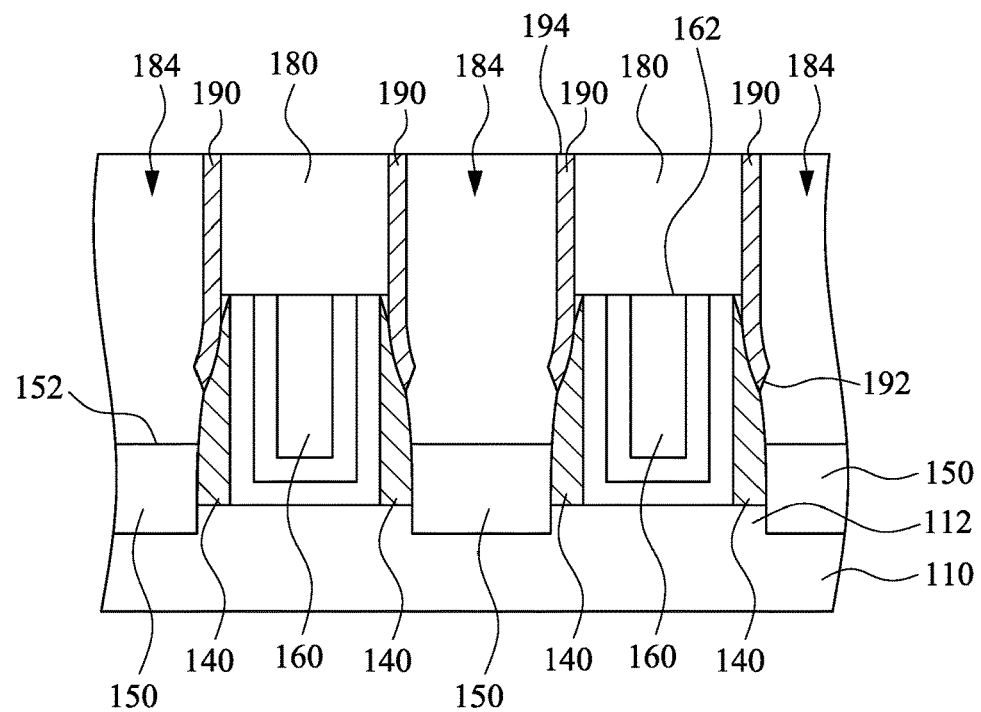
Figure 6C:
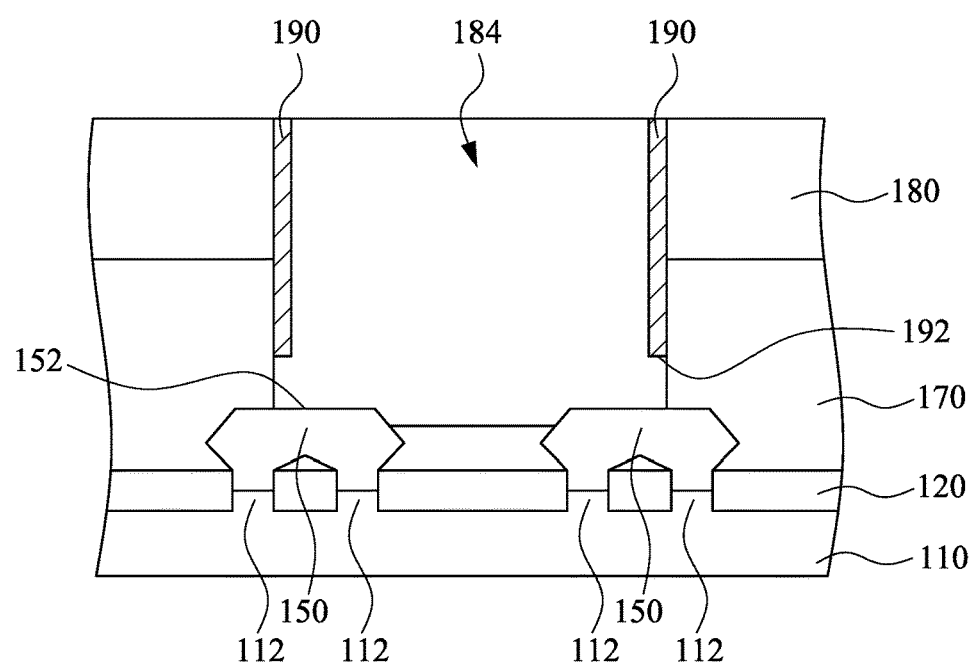

Reference is made to FIGS. 6A to 6C. The openings 182 in FIGS. 5A to 5C are further etched downwardly to form openings 184 that expose the epitaxy structures 150. The openings 184 can be formed by various methods, including a dry etch, a wet etch, or a combination of dry etch and wet etch. During the etching process, bottom portions of the contact spacers 190 as shown in FIGS. 5B and 5C are removed accordingly, such that the remained portions of the contact spacers 190 are in contact with the sidewalls of the openings 184. A top surface 194 of the contact spacer 190 is higher than a top surface 162 of the gate structure 160.

Moreover, since the bottom portions of the contact spacers 190 are removed, the bottom surfaces 192 of the contact spacers 190 are separated from the epitaxy structures 150. In other words, the top surfaces 152 of the epitaxy structures 150 are not covered by the contact spacers 190. As such, the epitaxy structures 150 and the contact 210 formed in the openings 184 (see FIGS. 7A to 7C) have large contact area, and the device performance can be improved.

Figure 7A:
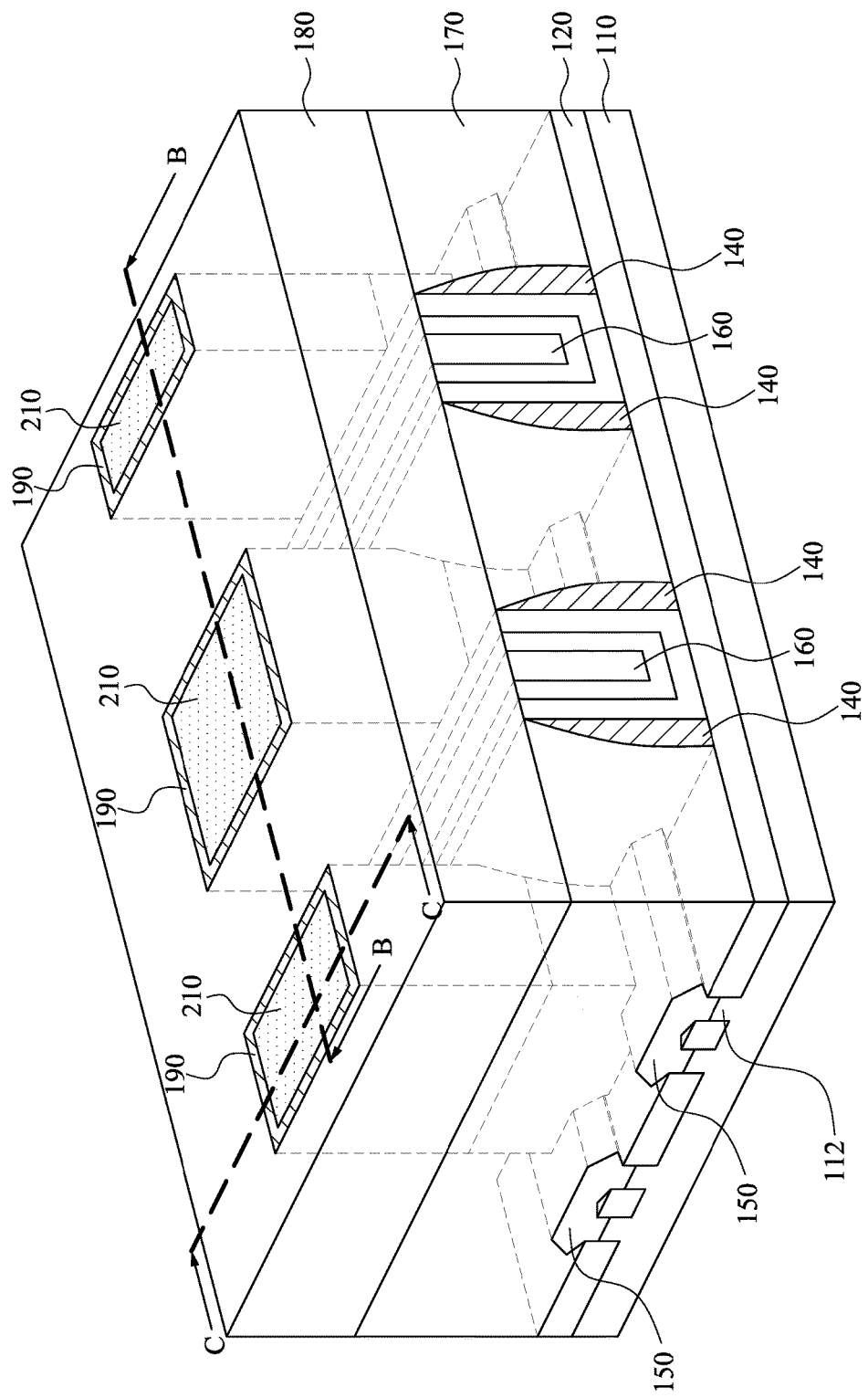
Figure 7B:
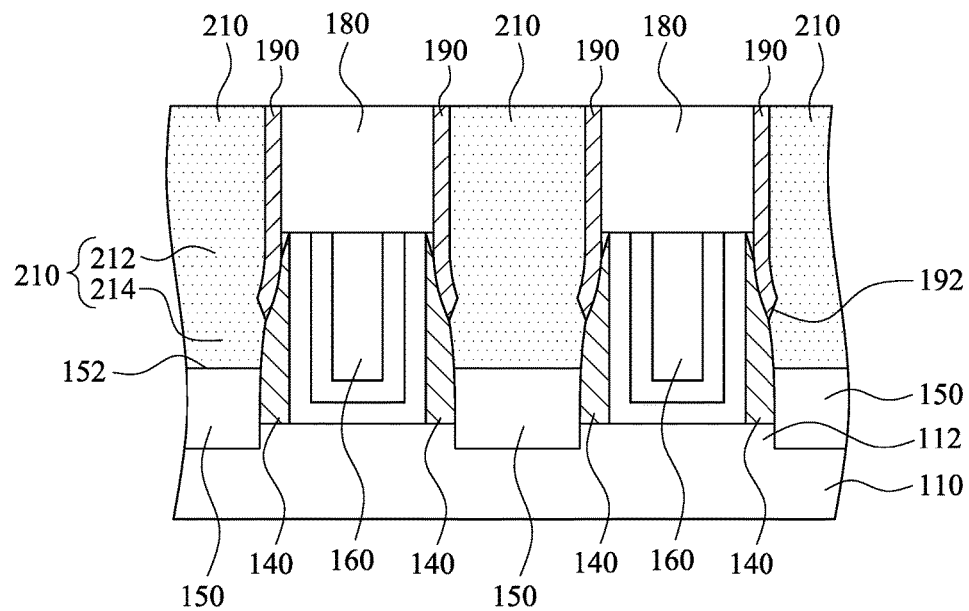
Figure 7C:
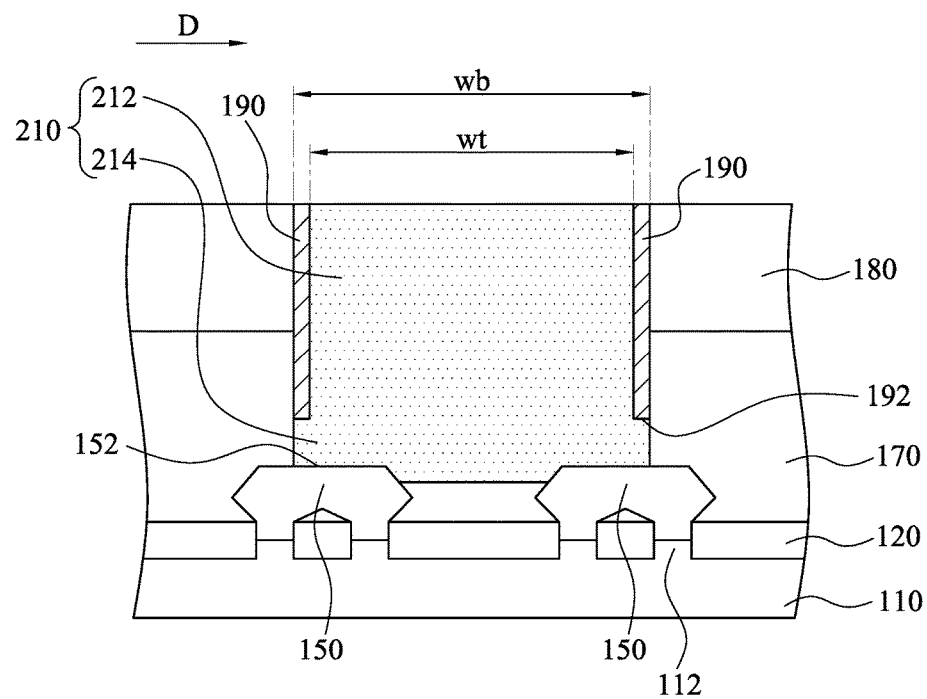

Reference is made to FIGS. 7A to 7C. A plurality of contacts 210 are respectively formed in the openings 184 of FIGS. 6A to 6C. That is, the dielectric layers, i.e., the contact spacers 210 and the interlayer dielectrics 170 and 180, surround the contacts 210. The contacts 210 are connected to the epitaxy structures 150. In some embodiments, metal materials can be filled in the openings 184, and the excessive portions of the metal materials are removed by performing a CMP process to form the contacts 210. The contacts 210 can be made of tungsten, aluminum, copper, or other suitable materials.

In FIGS. 7B and 7C, the contact 210 includes a top portion 212 and a bottom portion 214 disposed between the top portion 212 and the epitaxy structure 150. The top portion 212 of the contact 210 is in contact with the contact spacers 190. That is, the contact spacer 190 (and the gate spacer 140) is(are) disposed between the top portion 212 of the contact 210 and the gate structure 160. The bottom portion 214 of the contact 210 is in contact with the bottom surface 192 of the contact spacer 190, the gate spacer 140, the interlayer dielectric 170, and the epitaxy structure 150. Furthermore, the bottom portion 214 of the contact 210 is disposed between the bottom surface 192 of the contact spacer 190 and a top surface 152 of the epitaxy structure 150. A width wb of the bottom portion 214 along an extension direction D of the gate structure 160 is greater than a width wt of the top portion 212 along the extension direction D.

With such configuration, the contact spacers and the gate spacers can be isolation structures between the contact and the gate structure to perform a good isolation between the contact and the gate structure. Furthermore, since the contact spacers are not directly formed on the top surface of the epitaxy structures, there is no spacer residue of the contact spacers formed on the top surface of the epitaxy structures. As such, the contact area between the contact and the epitaxy structure is large, and the device performance can be improved.

Figure 8A:
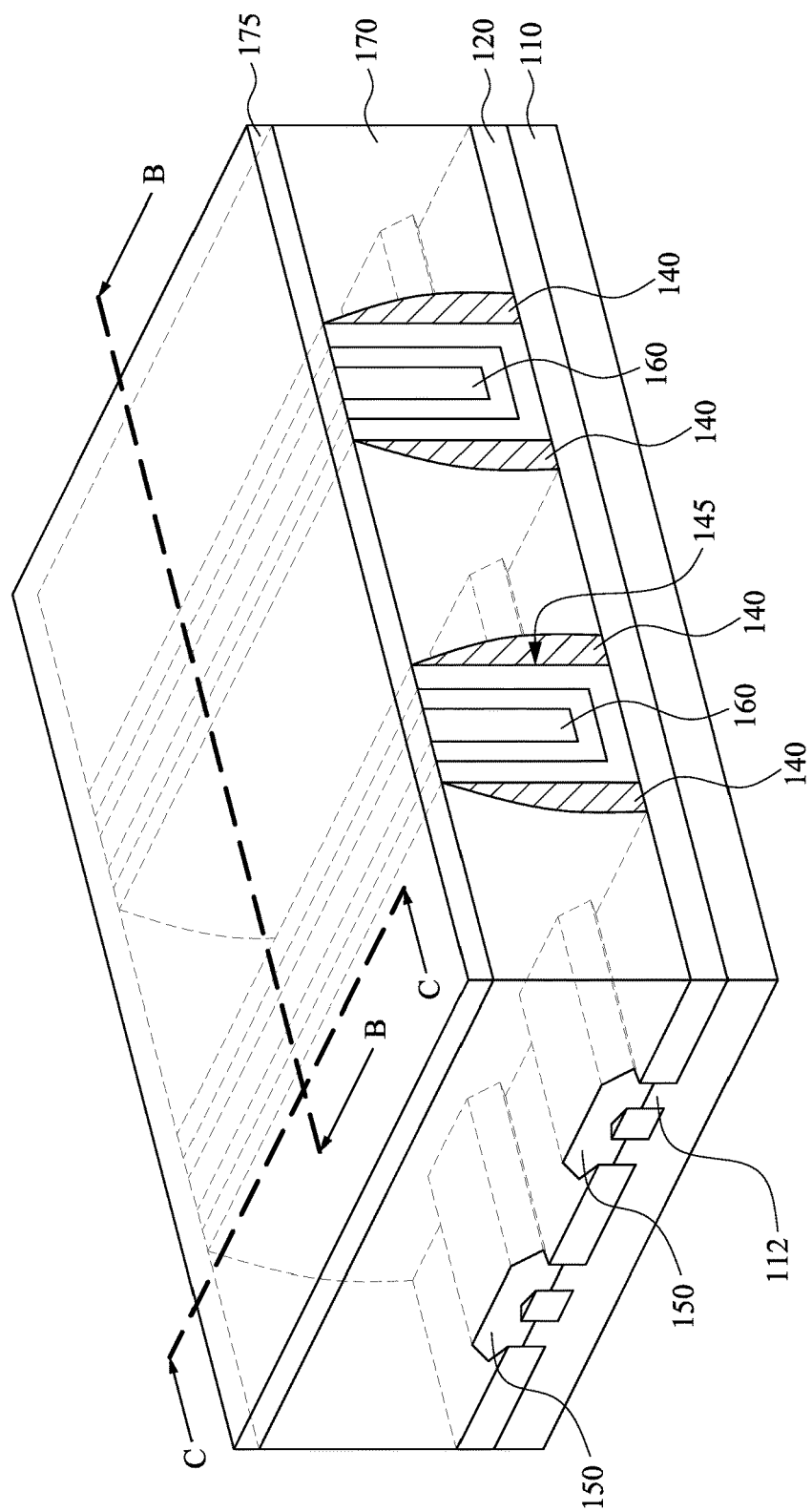
Figure 8B:
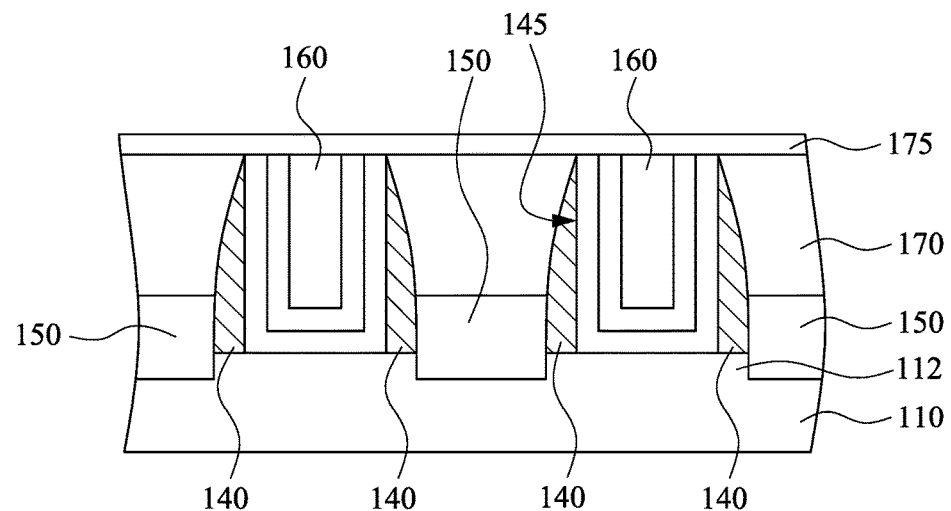
Figure 8C:
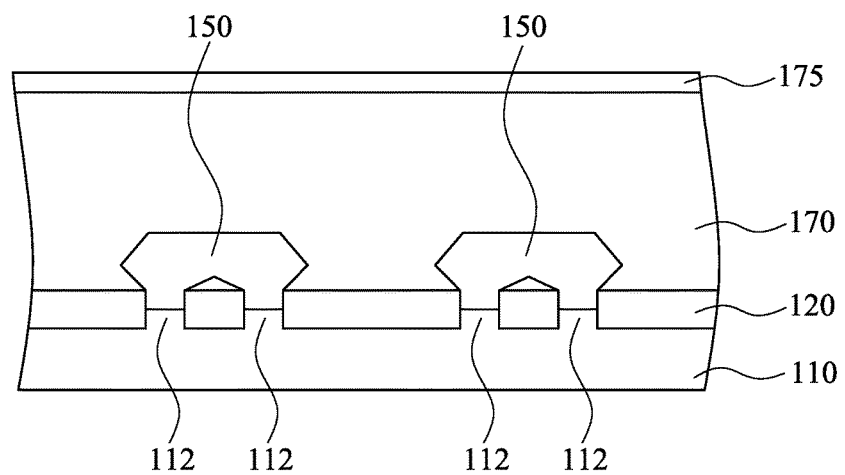

FIGS. 8A to 12A are perspective views of a method for manufacturing a semiconductor device at various stages in accordance with some embodiments of the present disclosure, FIGS. 8B to 12B are cross-sectional view respectively taking along line B-B of FIGS. 8A to 12A, and FIGS. 8C to 12C are cross-sectional view respectively taking along line C-C of FIGS. 8A to 12A. Reference is made to FIGS. 8A to 8C. The manufacturing processes of FIGS. 1A to 3C are performed in advance. Since the relevant manufacturing details are similar to FIGS. 1A to 3C, and, therefore, a description in this regard will not be repeated hereinafter. Reference is made to FIGS. 8A to 8C. An etch stop layer 175 is formed on the interlayer dielectric 170 and the gate structure 160. The etch stop layer 175 may include dielectric material or non-conductive material.

Figure 9A:
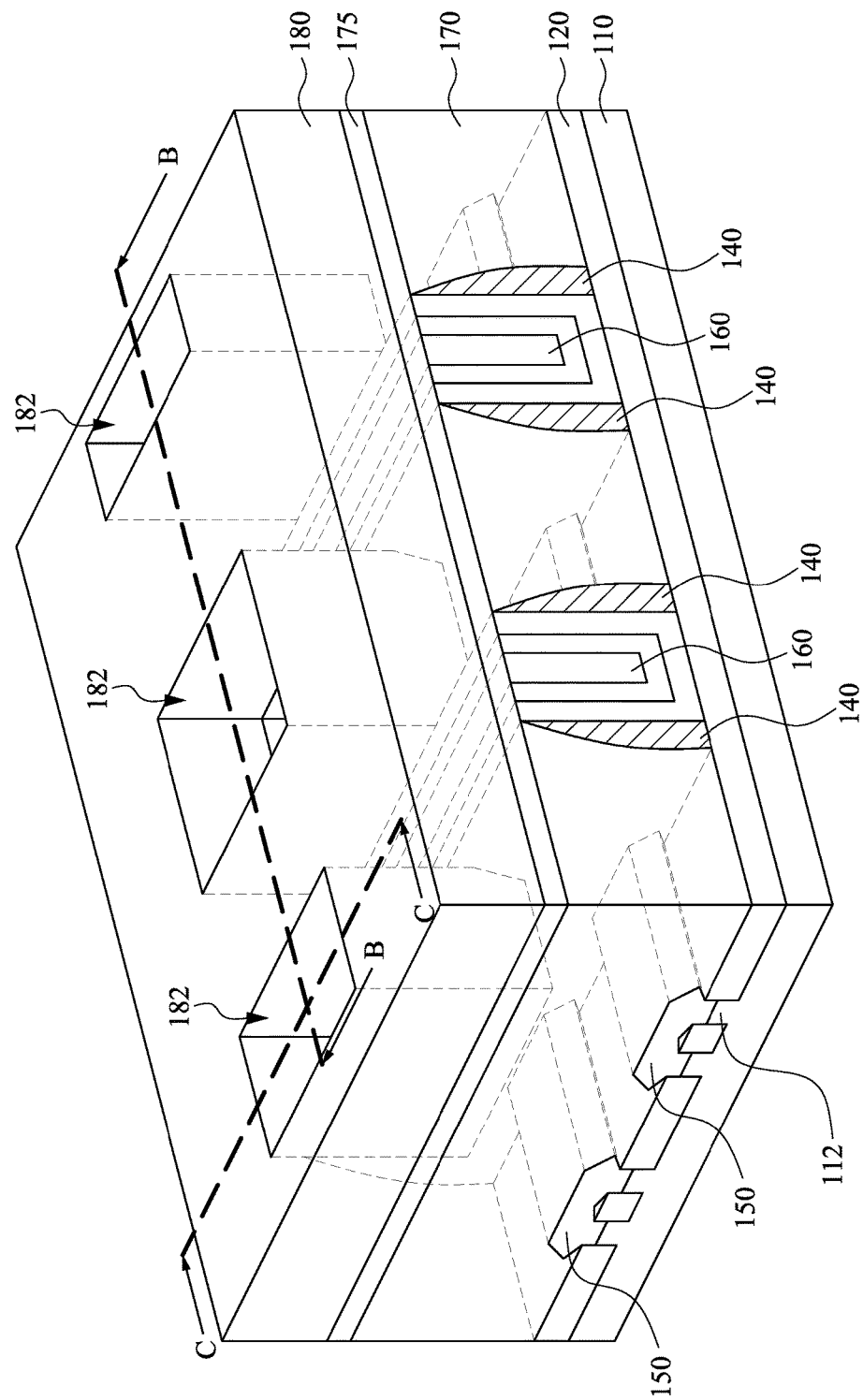
Figure 9B:
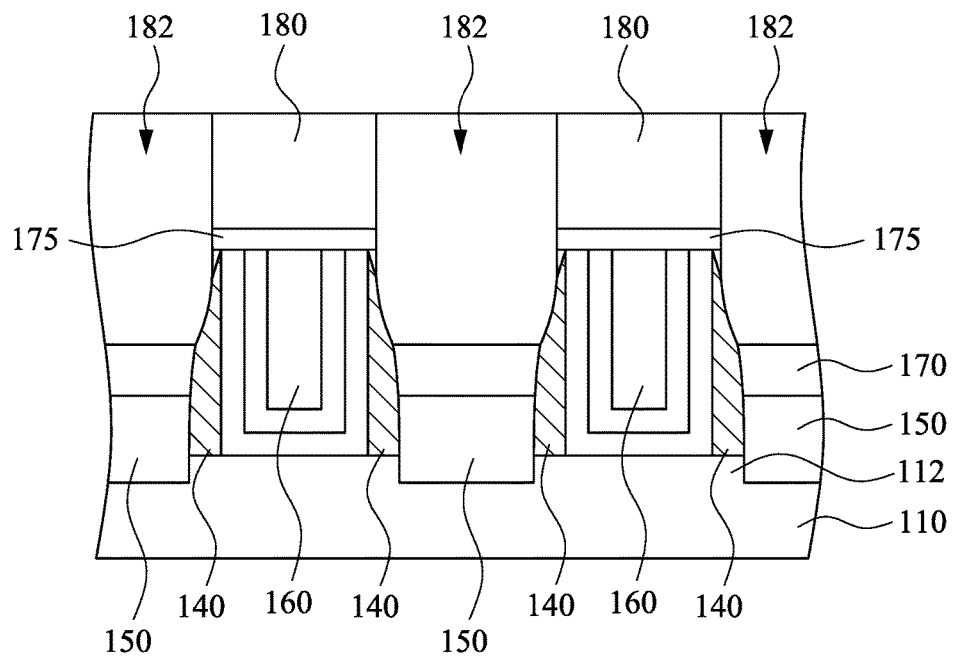
Figure 9C:
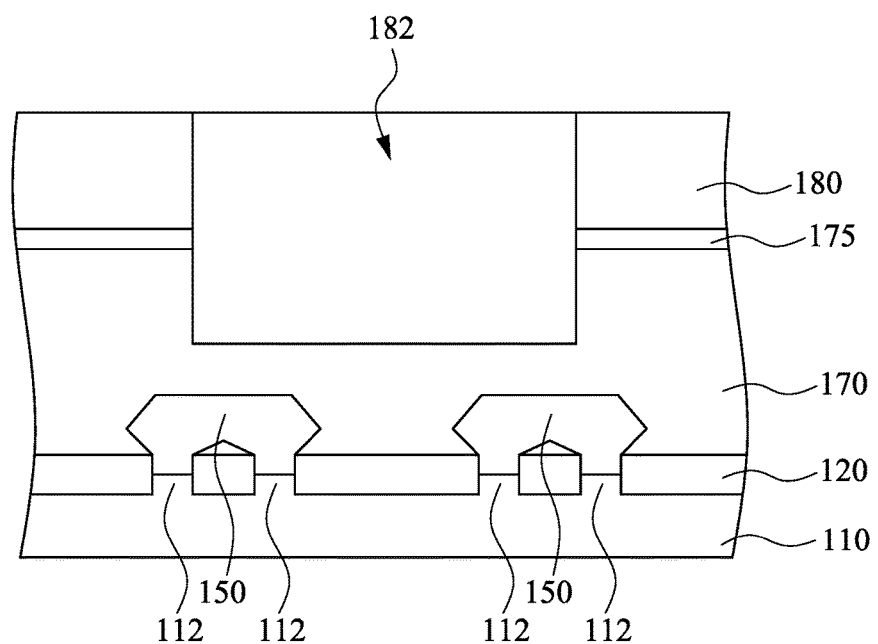

Reference is made to FIGS. 9A to 9C. Another dielectric layer, an interlayer dielectric (ILD) 180 for example, is then formed to cover the etch stop layer 175. The interlayer dielectric 180 may be formed by chemical vapor deposition (CVD), high-density plasma CVD, spin-on, sputtering, or other suitable methods. In some embodiments, the interlayer dielectric 180 includes silicon oxide. In some other embodiments, the interlayer dielectric 180 may include silicon oxy-nitride, silicon nitride, or a low-k material.

The interlayer dielectrics 180, 170 and the etch stop layer 175 are then etched to form a plurality of openings 182 by various methods, including a dry etch, a wet etch, or a combination of dry etch and wet etch. Since the structure of FIGS. 9A to 9C includes the etch stop layer 175, the etching depth of the openings 182 can be well controlled. The openings 182 extend substantially vertically through the interlayer dielectric 180, 170 and the etch stop layer 175. However, the openings 182 do not expose the epitaxy structures 150. That is, the bottom surface of the openings 182 are above the epitaxy structures 150. In some embodiments, top portions of the gate spacers 140 are removed when the openings 182 are formed. Therefore, the openings 182 expose the top portions of the gate spacers 140. In some embodiments, the openings 182 may expose the sidewalls of the gate structure 160 depending on the sizes of the openings 182. The term "substantially" as used herein may be applied to modify any quantitative representation which could permissibly vary without resulting in a change in the basic function to which it is related.

Figure 10A:
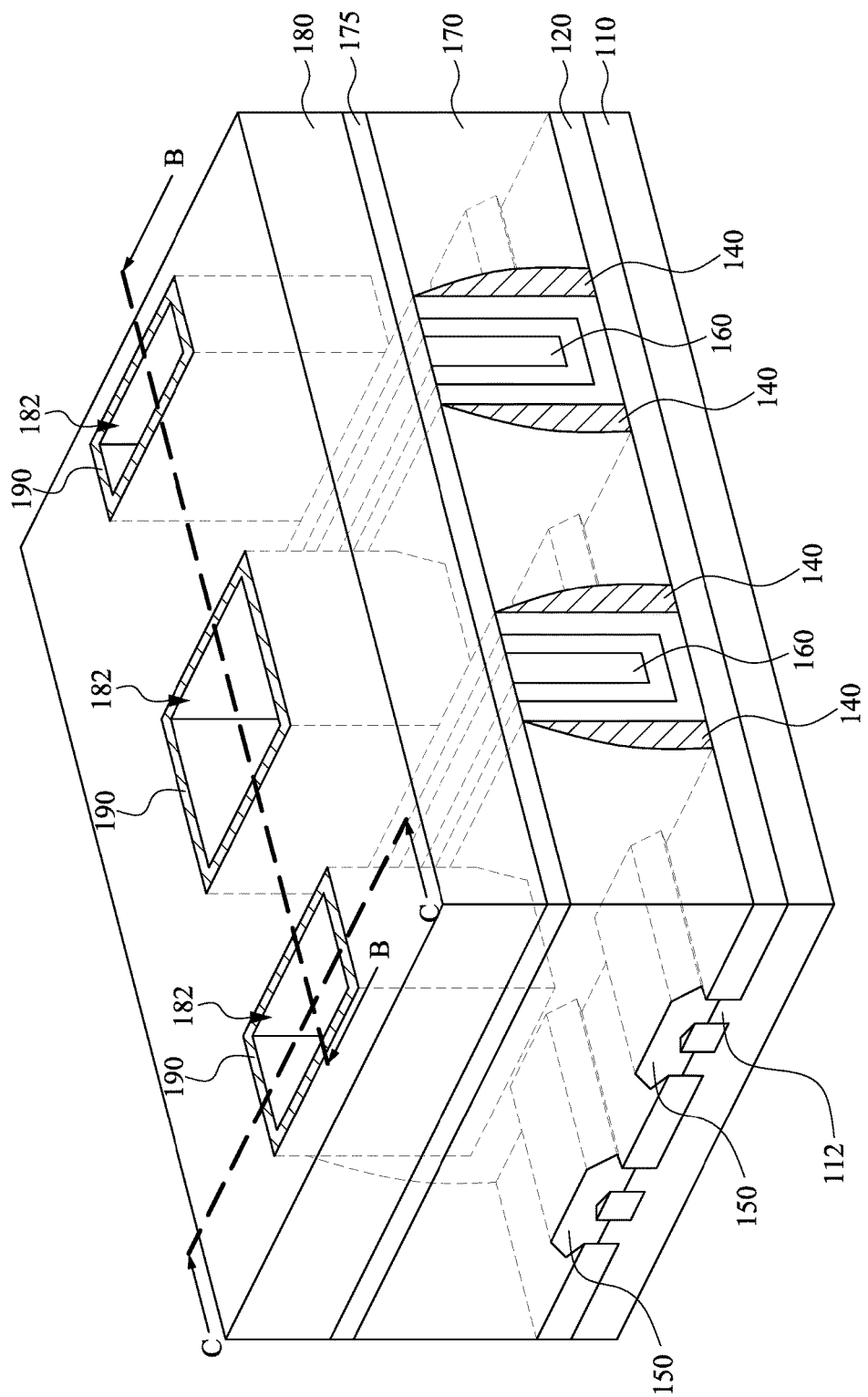
Figure 10B:
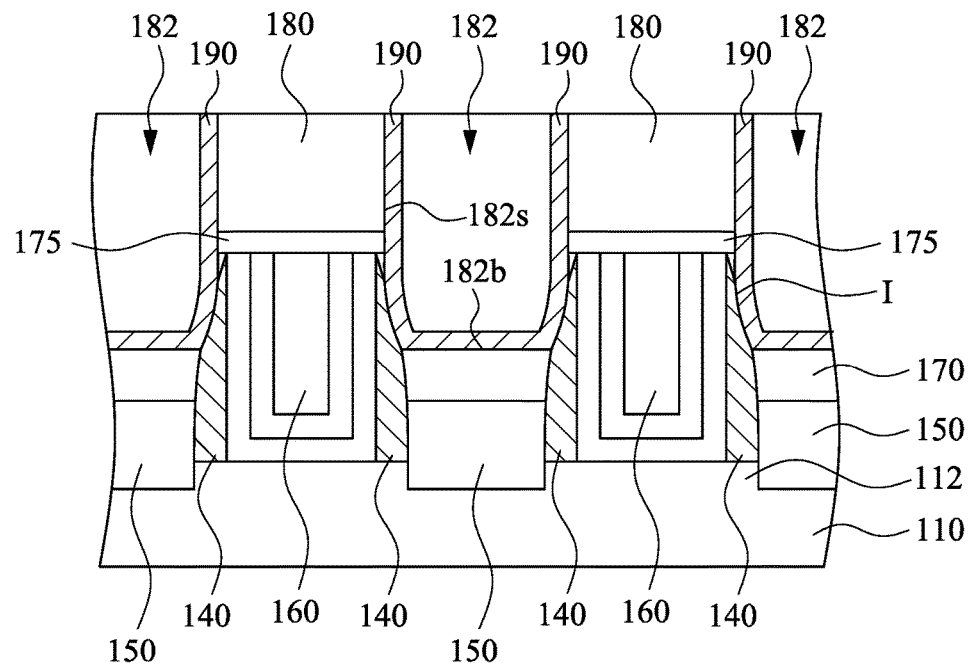
Figure 10C:
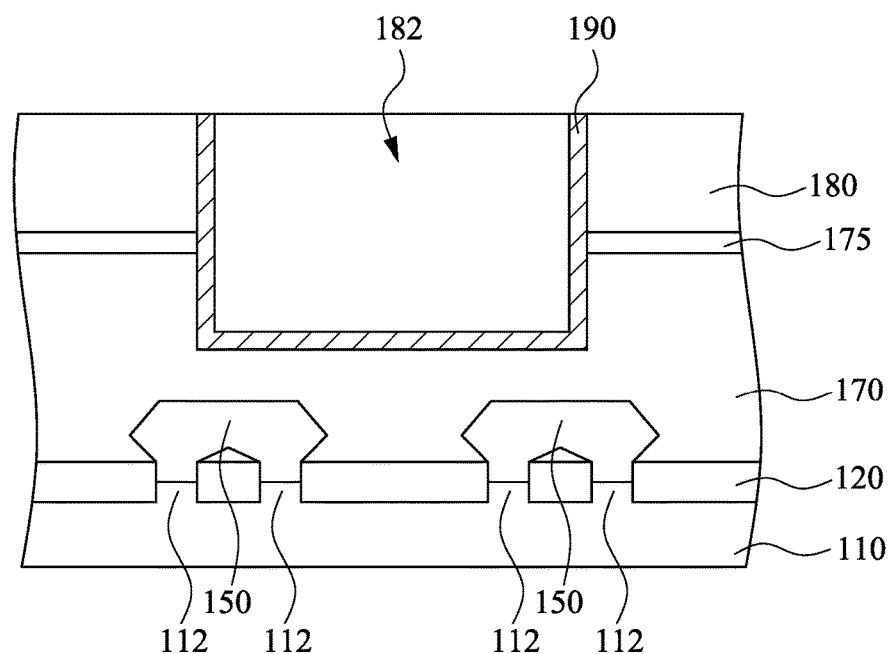

Reference is made to FIGS. 10A to 10C. A plurality of contact spacers 190 are conformally formed in the openings 182 and in contact with sidewalls of the openings 182. For example, the contact spacers 190 are formed by blanket depositing a dielectric layer (not shown) on the previously formed structure (i.e., the structure in FIGS. 9A to 9C). The dielectric layer(s) may include silicon nitride (SiN), oxynitride, silicon carbon (SiC), silicon oxynitride (SiON), oxide, and the like and may be formed by methods utilized to form such a layer, such as chemical vapor deposition (CVD), plasma enhanced CVD, sputter, and other methods known in the art. Subsequently, a chemical mechanical planarization (CMP) process may then be performed to planarize the dielectric layer to form the contact spacers 190.

In FIGS. 10B and 10C, the contact spacers 190 are in contact with the sidewalls 182s and the bottom surface 182b of the openings 182. In other words, the contact spacers 190 are in contact with the gate spacers 140, the stop etch layer 175, and the interlayer dielectrics 170 and 180. That is, an interface I is formed between the contact spacer 190 and the gate spacer 140. Furthermore, the contact spacers 190 are disposed above the epitaxy structures 150, such that the contact spacers 190 are separated from the epitaxy structures 150.

Figure 11A:
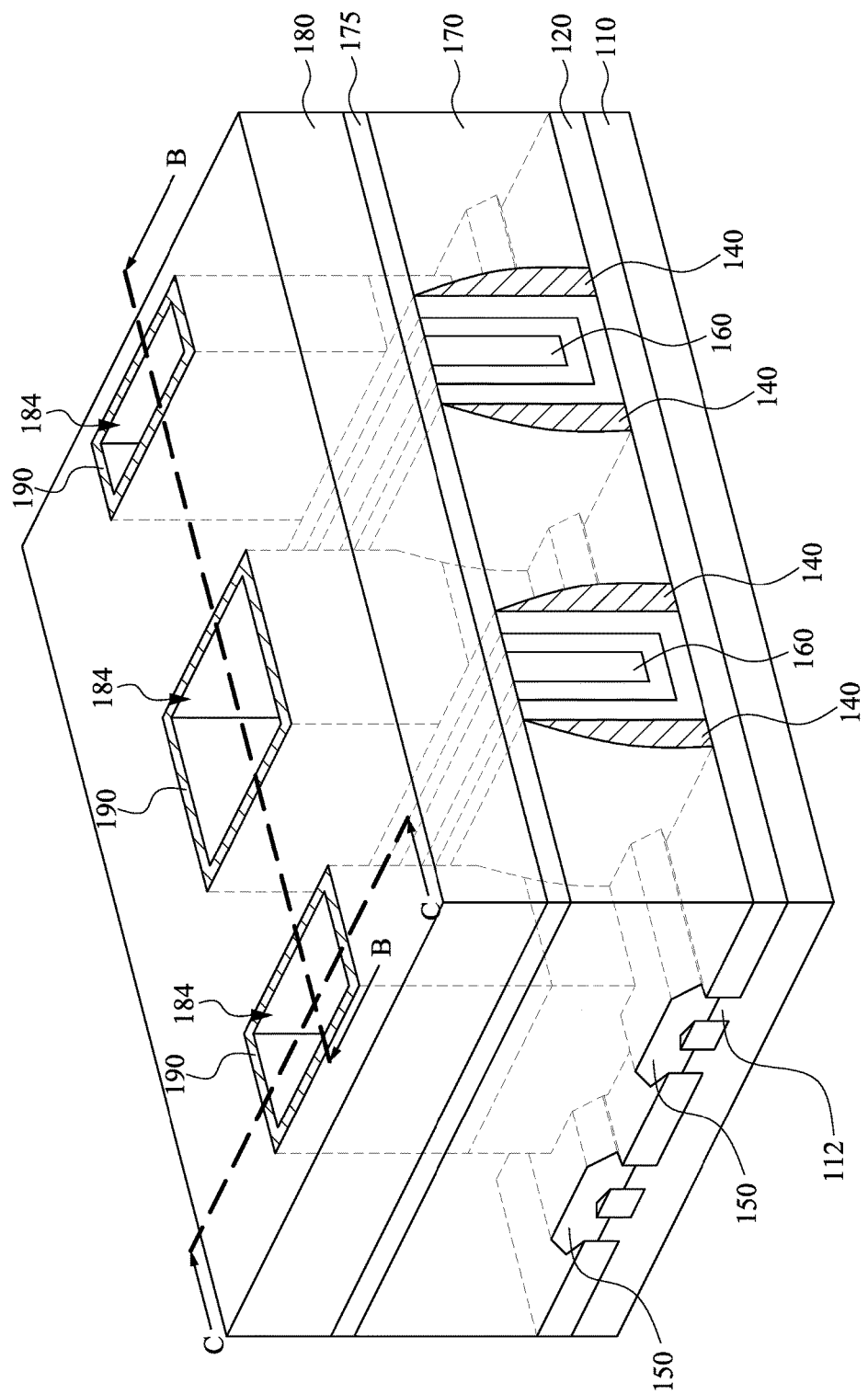
Figure 11B:
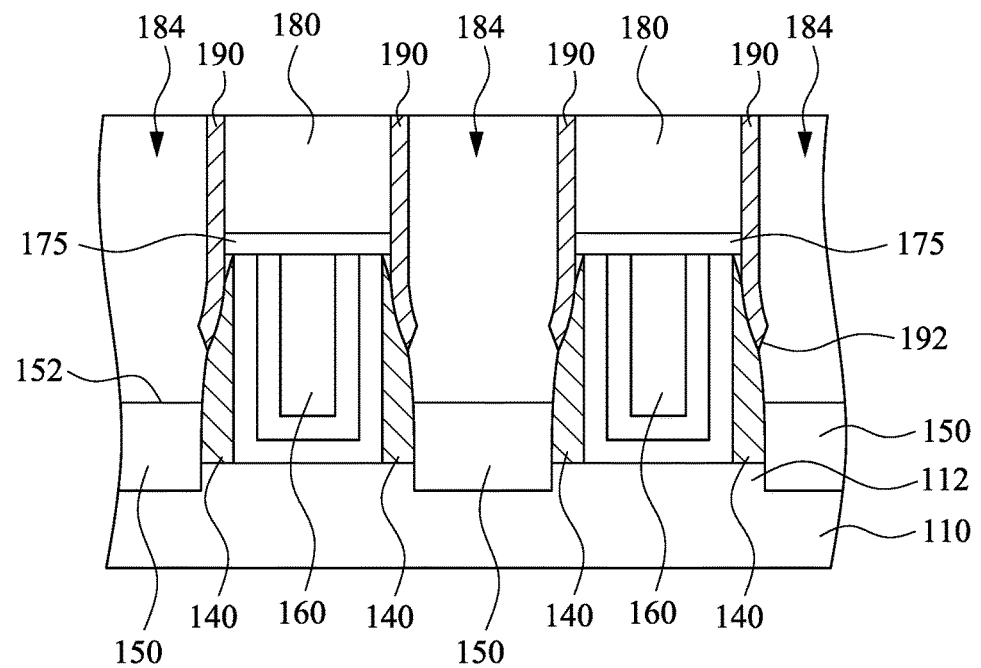
Figure 11C:
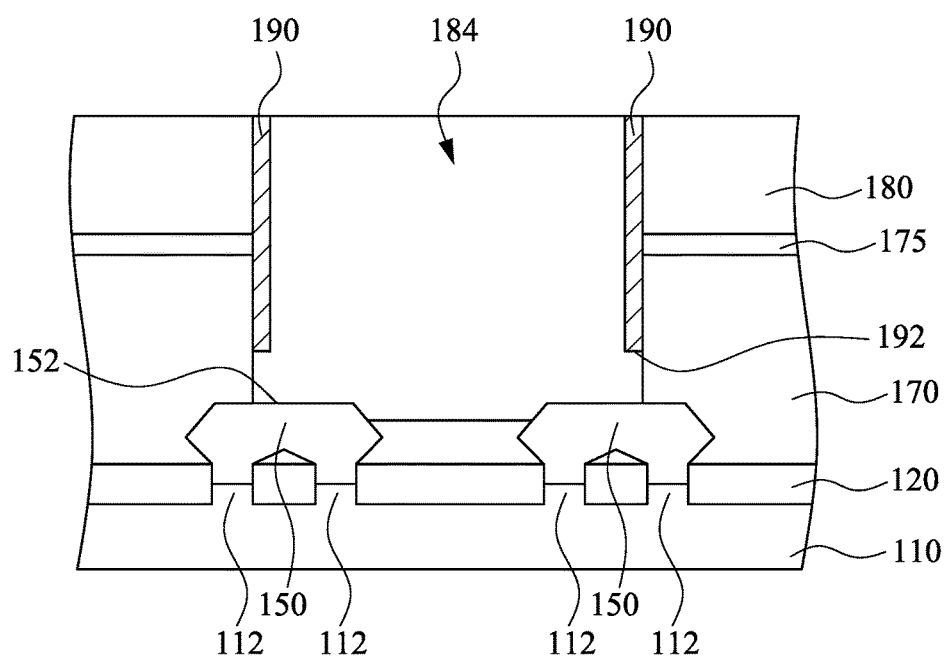

Reference is made to FIGS. 11A to 11C. The openings 182 in FIGS. 10A to 10C are further etched downwardly to form openings 184 that expose the epitaxy structures 150. The openings 184 can be formed by various methods, including a dry etch, a wet etch, or a combination of dry etch and wet etch. During the etching process, bottom portions of the contact spacers 190 are removed accordingly, such that the remained portions of the contact spacers 190 are in contact with the sidewalls of the openings 184. A top surface 194 of the contact spacer 190 is higher than a top surface 162 of the gate structure 160. Moreover, since the bottom portions of the contact spacers 190 are removed, the bottom surfaces 192 of the contact spacers 190 are separated from the epitaxy structures 150. In other words, the top surfaces 152 of the epitaxy structures 150 are not covered by the contact spacers 190. As such, the epitaxy structures 150 and the contact 210 formed in the openings 184 (see FIGS. 12A to 12C) have large contact area, and the device performance can be improved.

Figure 12A:
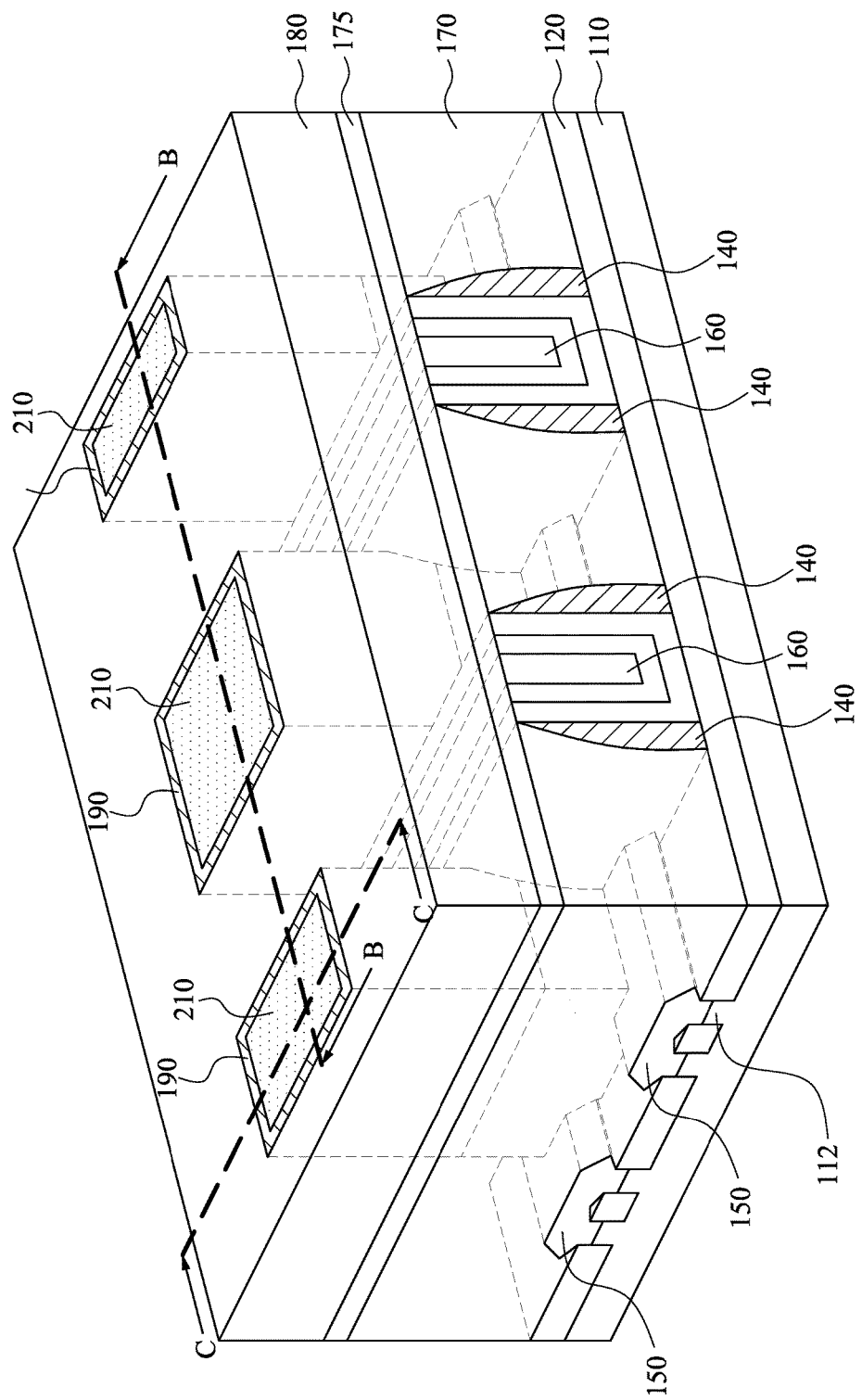
Figure 12B:
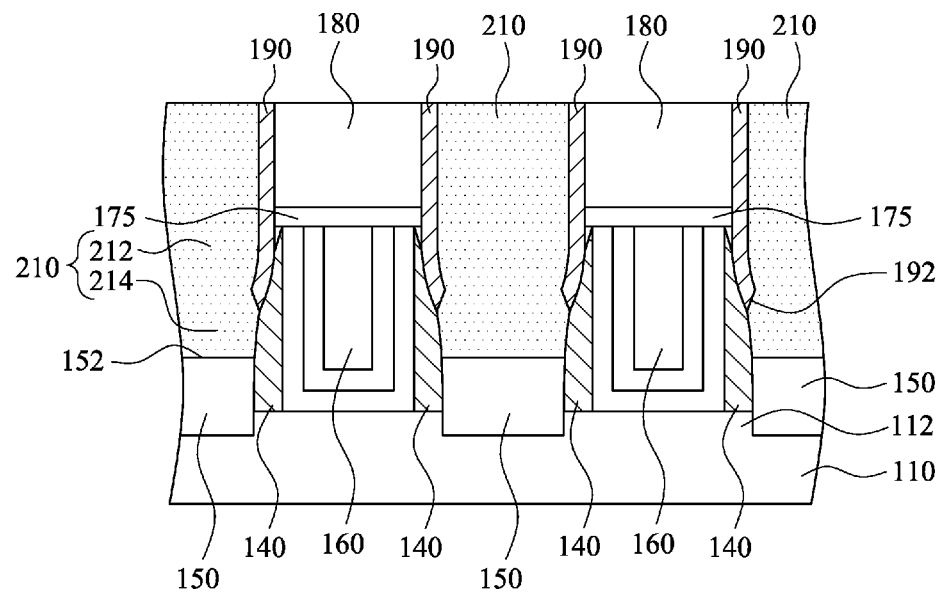
Figure 12C:
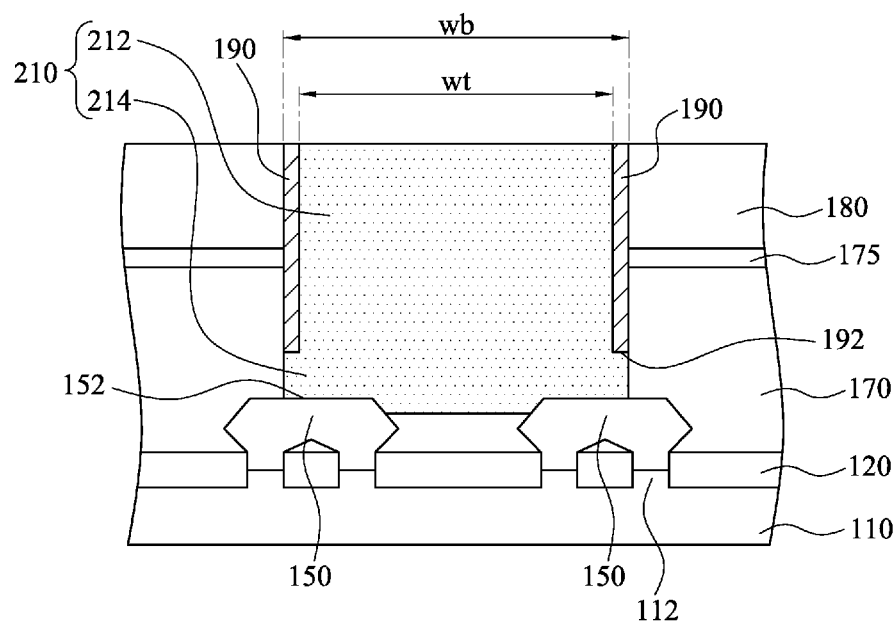

Reference is made to FIGS. 12A to 12C. A plurality of contacts 210 are respectively formed in the openings 184 of FIGS. 11A to 11C. That is, the dielectric layers, i.e., the contact spacers 210, the etch stop layer 175, and the interlayer dielectrics 170 and 180, surround the contacts 210. The contacts 210 are connected to the epitaxy structures 150. In some embodiments, metal materials can be filled in the openings 184, and the excessive portions of the metal materials are removed by performing a CMP process to form the contacts 210. The contacts 210 can be made of tungsten, aluminum, copper, or other suitable materials.

In FIGS. 12B and 12C, the contact 210 includes a top portion 212 and a bottom portion 214 disposed between the top portion 212 and the epitaxy structure 150. The top portion 212 of the contact 210 is in contact with the contact spacers 190. That is, the contact spacer 190 (and the gate spacer 140) is(are) disposed between the top portion 212 of the contact 210 and the gate structure 160. The bottom portion 214 of the contact 210 is in contact with the bottom surface 192 of the contact spacer 190, the gate spacer 140, the interlayer dielectric 170, and the epitaxy structure 150. Furthermore, the bottom portion 214 of the contact 210 is disposed between the bottom surface 192 of the contact spacer 190 and a top surface 152 of the epitaxy structure 150. A width wb of the bottom portion 214 along an extension direction D of the gate structure 160 is greater than a width wt of the top portion 212 along the extension direction D.

With such configuration, the contact spacers and the gate spacers can be isolation structures between the contact and the gate structure to perform a good isolation between the contact and the gate structure. Furthermore, since the contact spacers are not directly formed on the top surface of the epitaxy structures, there is no spacer residue of the contact spacers formed on the top surface of the epitaxy structures. As such, the contact area between the contact and the epitaxy structure is large, and the device performance can be improved.

According to some embodiments, a semiconductor device includes a substrate, a source/drain feature, a gate structure, a contact, a gate spacer, and a contact spacer. The source/drain feature is at least partially disposed in the substrate. The gate structure is disposed on the substrate and adjacent to the source/drain feature. The contact is electrically connected to the source/drain feature. The gate spacer is disposed on a sidewall of the gate structure and between the gate structure and the contact. The contact spacer is disposed on the gate spacer and on a sidewall of the contact. An interface is formed between the gate spacer and the contact spacer, and a bottom surface of the contact spacer is in contact with the contact.

According to some embodiments, a semiconductor device includes a substrate, a gate structure, an epitaxy structure, a contact, a gate spacer, and a contact spacer. The substrate includes at least one semiconductor fin. The gate structure is disposed on the substrate and adjacent to the semiconductor fin. The epitaxy structure is disposed on the semiconductor fin. The contact is electrically connected to the epitaxy structure. The gate spacer is disposed on a sidewall of the gate structure and between the gate structure and the contact. The contact spacer is disposed on the gate spacer and on a sidewall of the contact. The contact spacer is separated from a top surface of the epitaxy structure.

According to some embodiments, a method for manufacturing a semiconductor device includes forming a source/drain feature at least partially in a substrate. A gate structure is formed on the substrate and adjacent to the source/drain feature. The interlayer dielectric is formed on the gate structure and the substrate. The interlayer dielectric is recessed to form an opening above the source/drain feature to expose a portion of the interlayer dielectric above the source/drain feature. The contact spacer is formed in the opening and in contact with sidewalls and a bottom surface of the opening. The opening is further recessed to remove a bottom portion of the contact spacer and expose the source/drain feature. A contact is formed in the further recessed opening and in contact with the contact spacer and the source/drain feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a source/drain feature at least partially disposed in the substrate;
   a gate structure disposed on the substrate and adjacent to the source/drain feature;
   a contact electrically connected to the source/drain feature;
   a gate spacer disposed on a sidewall of the gate structure and between the gate structure and the contact; and
   a contact spacer disposed on the gate spacer and on a sidewall of the contact, wherein an interface is formed between the gate spacer and the contact spacer, and a bottom surface of the contact spacer is in direct contact with the contact.

2. The semiconductor device of claim 1, wherein the contact comprises:
   a top portion having a first width; and
   a bottom portion disposed between the top portion and the source/drain feature and having a second width greater than the first width.

3. The semiconductor device of claim 2, wherein the bottom surface of the contact spacer is in direct contact with the bottom portion of the contact.

4. The semiconductor device of claim 2, wherein the bottom portion of the contact is in contact with the gate spacer, and the top portion of the contact is in contact with the contact spacer.

5. The semiconductor device of claim 1, further comprising an interlayer dielectric disposed on the substrate and adjacent to the gate structure.

6. The semiconductor device of claim 5, wherein the interlayer dielectric is in contact with the contact spacer and the contact.

7. The semiconductor device of claim 5, wherein the interlayer dielectric comprises a top interlayer dielectric and a bottom interlayer dielectric disposed between the top interlayer dielectric and the substrate, and the semiconductor device further comprises an etch stop layer disposed between the top interlayer dielectric and the bottom interlayer dielectric.

8. The semiconductor device of claim 7, wherein the etch stop layer is in contact with the contact spacer.

9. The semiconductor device of claim 1, wherein the contact spacer is spaced apart from the source/drain feature.

10. The semiconductor device of claim 1, wherein a top surface of the contact spacer is higher than a top surface of the gate structure.

11. A semiconductor device comprising:
a substrate comprising at least one semiconductor fin;
a gate structure disposed on the substrate and adjacent to the semiconductor fin;
an epitaxy structure disposed on the semiconductor fin;
a contact electrically connected to the epitaxy structure;
a gate spacer disposed on a sidewall of the gate structure and between the gate structure and the contact; and
a contact spacer disposed on the gate spacer and on a sidewall of the contact, wherein a bottommost surface of the contact is lower than a bottommost surface of the contact spacer.

12. The semiconductor device of claim 11, wherein at least a portion of the contact is disposed between the gate spacer and the epitaxy structure.

13. The semiconductor device of claim 11, wherein at least a portion of the gate spacer is disposed between the contact spacer and the gate structure.

14. The semiconductor device of claim 10, further comprising an interlayer dielectric disposed on the substrate and in contact with the contact and the contact spacer.

15. The semiconductor device of claim 10, further comprising an etch stop layer disposed on the gate structure and in contact with the gate spacer.

16. A semiconductor device comprising:
a substrate;
a source/drain feature at least partially disposed in the substrate;
a gate structure disposed on the substrate and adjacent to the source/drain feature;
a contact electrically connected to the source/drain feature;
a contact spacer disposed on a sidewall of the contact, wherein a portion of the contact is sandwiched between a bottommost surface of the contact spacer and a topmost surface of the source/drain feature.

17. The semiconductor device of claim 16, further comprising:
a gate spacer disposed on a sidewall of the gate structure and in contact with the contact.

18. The semiconductor device of claim 17, wherein a portion of the gate spacer is disposed between the contact spacer and the gate structure.

19. The semiconductor device of claim 17, further comprising an etch stop layer disposed on the gate structure and in contact with the gate spacer.

20. The semiconductor device of claim 16, wherein the contact spacer is free from in contact with the source/drain feature.

* * * * *